US00RE42097E

(19) United States
(12) Reissued Patent
Yamazaki et al.

(10) Patent Number: US RE42,097 E
(45) Date of Reissued Patent: *Feb. 1, 2011

(54) METHOD OF FABRICATING A SEMICONDUCTOR DEVICE

(75) Inventors: Shunpei Yamazaki, Tokyo (JP); Hisashi Ohtani, Tochigi (JP)

(73) Assignee: Semiconductor Energy Laboratory Co., Ltd., Atsugi-shi, Kanagawa-ken (JP)

( * ) Notice: This patent is subject to a terminal disclaimer.

(21) Appl. No.: 12/418,334

(22) Filed: Apr. 3, 2009

Related U.S. Patent Documents

Reissue of:
(64) Patent No.: 7,473,592
Issued: Jan. 6, 2009
Appl. No.: 11/926,573
Filed: Oct. 29, 2007

U.S. Applications:

(60) Continuation of application No. 11/731,415, filed on Mar. 30, 2007, now Pat. No. 7,473,971, which is a continuation of application No. 10/914,357, filed on Aug. 9, 2004, now Pat. No. 7,476,576, which is a continuation of application No. 09/808,162, filed on Mar. 13, 2001, now Pat. No. 6,803,264, which is a division of application No. 09/386,782, filed on Aug. 31, 1999, now Pat. No. 6,335,231.

(30) Foreign Application Priority Data

Sep. 4, 1998 (JP) ..... 10-251635

(51) Int. Cl.
*H01L 21/30* (2006.01)
*H01L 21/84* (2006.01)

(52) U.S. Cl. ..... 438/151; 438/164; 438/458; 438/459; 257/E21.563; 257/E21.569

(58) Field of Classification Search ..... 438/149, 438/151, 164, 459
See application file for complete search history.

(56) References Cited

U.S. PATENT DOCUMENTS

| | | | |
|---|---|---|---|
| 3,964,941 | A | 6/1976 | Wang |
| 4,217,153 | A | 8/1980 | Fukunaga |
| 4,583,122 | A | 4/1986 | Ohwada |
| 4,665,419 | A | 5/1987 | Sasaki |
| 4,733,947 | A | 3/1988 | Ota |
| 4,753,896 | A | 6/1988 | Matloubian |
| 4,768,076 | A | 8/1988 | Aoki |
| 4,786,955 | A | 11/1988 | Plus |
| 4,822,752 | A | 4/1989 | Sugahara |

(Continued)

FOREIGN PATENT DOCUMENTS

| | | |
|---|---|---|
| EP | 0 485 233 | 5/1992 |

(Continued)

OTHER PUBLICATIONS

Notice of Allowance (U.S. Appl. No. 12/418,280) dated Aug. 16, 2010.

(Continued)

*Primary Examiner*—Alexander G Ghyka
(74) *Attorney, Agent, or Firm*—Eric J. Robinson; Robinson Intellectual Property Law Office, P.C.

(57) ABSTRACT

A semiconductor device with high reliability is provided using an SOI substrate. When the SOI substrate is fabricated by using a technique typified by SIMOX, ELTRAN, or Smart-Cut, a single crystal semiconductor substrate having a main surface (crystal face) of a {110} plane is used. In such an SOI substrate, adhesion between a buried insulating layer as an under layer and a single crystal silicon layer is high, and it becomes possible to realize a semiconductor device with high reliability.

37 Claims, 9 Drawing Sheets

U.S. PATENT DOCUMENTS

| | | | |
|---|---|---|---|
| 4,857,986 | A | 8/1989 | Kinugawa |
| 4,899,202 | A | 2/1990 | Blake |
| 4,933,298 | A | 6/1990 | Hasegawa |
| 4,943,837 | A | 7/1990 | Konishi et al. |
| 5,002,630 | A | 3/1991 | Kermani |
| 5,059,304 | A | 10/1991 | Field |
| 5,130,770 | A | 7/1992 | Blanc |
| 5,215,931 | A | 6/1993 | Houston |
| 5,243,213 | A | 9/1993 | Miyazawa |
| 5,258,323 | A | 11/1993 | Sarma |
| 5,261,999 | A | 11/1993 | Pinker |
| 5,289,030 | A | 2/1994 | Yamazaki et al. |
| 5,317,236 | A | 5/1994 | Zavracky |
| 5,341,028 | A | 8/1994 | Yamaguchi |
| 5,371,037 | A | 12/1994 | Yonehara |
| 5,374,564 | A | 12/1994 | Bruel |
| 5,387,555 | A | 2/1995 | Linn |
| 5,403,759 | A | 4/1995 | Havemann |
| 5,424,230 | A | 6/1995 | Wakai |
| 5,426,062 | A | 6/1995 | Hwang |
| 5,444,282 | A | 8/1995 | Yamaguchi |
| 5,508,209 | A | 4/1996 | Zhang |
| 5,550,070 | A | 8/1996 | Funai |
| 5,569,620 | A | 10/1996 | Linn |
| 5,573,961 | A | 11/1996 | Hsu |
| 5,574,292 | A | 11/1996 | Takahashi |
| 5,576,556 | A | 11/1996 | Takemura |
| 5,581,092 | A | 12/1996 | Takemura |
| 5,612,230 | A | 3/1997 | Yuzurihara |
| 5,640,033 | A | 6/1997 | Matsuoka |
| 5,643,826 | A | 7/1997 | Ohtani |
| 5,644,147 | A | 7/1997 | Yamazaki et al. |
| 5,648,277 | A | 7/1997 | Zhang |
| 5,693,959 | A | 12/1997 | Inoue et al. |
| 5,698,869 | A | 12/1997 | Yoshimi et al. |
| 5,710,057 | A | 1/1998 | Kenney |
| 5,714,395 | A | 2/1998 | Bruel |
| 5,719,065 | A | 2/1998 | Takemura |
| 5,729,045 | A | 3/1998 | Buynoski |
| 5,750,000 | A | 5/1998 | Yonehara |
| 5,767,529 | A | 6/1998 | Kobori et al. |
| 5,778,237 | A | 7/1998 | Yamamoto |
| 5,784,131 | A | 7/1998 | Kim et al. |
| 5,784,132 | A | 7/1998 | Hashimoto |
| 5,793,073 | A | 8/1998 | Kaminishi |
| 5,818,076 | A | 10/1998 | Zhang |
| 5,821,138 | A | 10/1998 | Yamazaki |
| 5,837,569 | A | 11/1998 | Makita et al. |
| 5,840,616 | A | 11/1998 | Sakaguchi |
| 5,841,173 | A | 11/1998 | Yamashita |
| 5,849,627 | A | 12/1998 | Linn |
| 5,854,123 | A | 12/1998 | Sato |
| 5,854,509 | A | 12/1998 | Kunikiyo |
| 5,856,229 | A | 1/1999 | Sakaguchi et al. |
| 5,869,387 | A | 2/1999 | Sato et al. |
| 5,877,070 | A | 3/1999 | Goesele |
| 5,882,987 | A | 3/1999 | Srikrishnan |
| 5,886,385 | A | 3/1999 | Arisumi |
| 5,893,730 | A | 4/1999 | Yamazaki et al. |
| 5,899,711 | A | 5/1999 | Smith |
| 5,904,528 | A | 5/1999 | Lin et al. |
| 5,913,111 | A | 6/1999 | Kataoka |
| 5,923,962 | A | 7/1999 | Ohtani |
| 5,926,430 | A | 7/1999 | Noda |
| 5,943,105 | A | 8/1999 | Fujikawa |
| 5,949,107 | A | 9/1999 | Zhang |
| 5,953,622 | A | 9/1999 | Lee |
| 5,962,897 | A | 10/1999 | Takemura |
| 5,965,918 | A | 10/1999 | Ono |
| 5,966,594 | A | 10/1999 | Adachi |
| 5,966,620 | A | 10/1999 | Sakaguchi |
| 5,982,002 | A | 11/1999 | Takasu |
| 5,985,681 | A | 11/1999 | Hamajima |
| 5,985,740 | A | 11/1999 | Yamazaki et al. |
| 5,989,981 | A | 11/1999 | Nakashima et al. |
| 6,020,252 | A | 2/2000 | Aspar |
| 6,027,988 | A | 2/2000 | Cheung et al. |
| 6,031,249 | A | 2/2000 | Yamazaki |
| 6,044,474 | A | 3/2000 | Klein |
| 6,049,092 | A | 4/2000 | Konuma |
| 6,051,453 | A | 4/2000 | Takemura |
| 6,054,363 | A | 4/2000 | Sakaguchi |
| 6,063,706 | A | 5/2000 | Wu |
| 6,077,731 | A | 6/2000 | Yamazaki et al. |
| 6,093,937 | A | 7/2000 | Yamazaki |
| 6,096,582 | A | 8/2000 | Inoue |
| 6,107,639 | A | 8/2000 | Yamazaki et al. |
| 6,107,654 | A | 8/2000 | Yamazaki |
| 6,118,148 | A | 9/2000 | Yamazaki |
| 6,121,117 | A | 9/2000 | Sato et al. |
| 6,124,613 | A | 9/2000 | Kokubun |
| 6,127,702 | A | 10/2000 | Yamazaki |
| 6,133,073 | A | 10/2000 | Yamazaki et al. |
| 6,140,667 | A | 10/2000 | Yamazaki |
| 6,157,421 | A | 12/2000 | Ishii |
| 6,165,880 | A | 12/2000 | Yaung |
| 6,171,982 | B1 | 1/2001 | Sato |
| 6,184,556 | B1 | 2/2001 | Yamazaki |
| 6,191,007 | B1 | 2/2001 | Matsui |
| 6,191,476 | B1 | 2/2001 | Takahashi |
| 6,207,969 | B1 | 3/2001 | Yamazaki |
| 6,211,041 | B1 | 4/2001 | Ogura |
| 6,218,678 | B1 | 4/2001 | Takemura |
| 6,246,068 | B1 | 6/2001 | Sato et al. |
| 6,262,438 | B1 | 7/2001 | Yamazaki |
| 6,268,842 | B1 | 7/2001 | Yamazaki et al. |
| 6,271,101 | B1 | 8/2001 | Fukunaga |
| 6,287,900 | B1 | 9/2001 | Yamazaki |
| 6,291,275 | B1 | 9/2001 | Yamazaki et al. |
| 6,294,478 | B1 | 9/2001 | Sakaguchi |
| 6,307,220 | B1 | 10/2001 | Yamazaki |
| 6,326,249 | B1 | 12/2001 | Yamazaki et al. |
| 6,331,208 | B1 | 12/2001 | Nishida |
| 6,335,231 | B1 | 1/2002 | Yamazaki |
| 6,335,716 | B1 | 1/2002 | Yamazaki et al. |
| 6,342,433 | B1 | 1/2002 | Ohmi |
| 6,350,702 | B2 | 2/2002 | Sakaguchi et al. |
| 6,365,933 | B1 | 4/2002 | Yamazaki et al. |
| 6,369,410 | B1 | 4/2002 | Yamazaki |
| 6,380,046 | B1 | 4/2002 | Yamazaki |
| 6,380,560 | B1 | 4/2002 | Yamazaki et al. |
| 6,388,291 | B1 | 5/2002 | Zhang |
| 6,388,652 | B1 | 5/2002 | Yamazaki |
| 6,420,759 | B2 | 7/2002 | Yamazaki |
| 6,421,754 | B1 | 7/2002 | Kau |
| 6,424,011 | B1 | 7/2002 | Assaderaghi |
| 6,433,361 | B1 | 8/2002 | Zhang |
| 6,452,211 | B1 | 9/2002 | Ohtani et al. |
| 6,455,401 | B1 | 9/2002 | Zhang |
| 6,458,637 | B1 | 10/2002 | Yamazaki et al. |
| 6,465,287 | B1 | 10/2002 | Yamazaki et al. |
| 6,528,820 | B1 | 3/2003 | Yamazaki et al. |
| 6,534,380 | B1 | 3/2003 | Yamauchi et al. |
| 6,549,184 | B1 | 4/2003 | Koyama et al. |
| 6,583,474 | B2 | 6/2003 | Yamazaki |
| 6,590,230 | B1 | 7/2003 | Yamazaki |
| 6,602,761 | B2 | 8/2003 | Fukunaga |
| 6,617,612 | B2 | 9/2003 | Zhang et al. |
| 6,667,494 | B1 | 12/2003 | Yamazaki et al. |
| 6,686,623 | B2 | 2/2004 | Yamazaki |
| 6,730,932 | B2 | 5/2004 | Yamazaki et al. |

| | | | | |
|---|---|---|---|---|
| 6,744,069 | B1 | 6/2004 | Yamazaki et al. | |
| 6,787,806 | B1 | 9/2004 | Yamazaki et al. | |
| 6,803,264 | B2 | 10/2004 | Yamazaki | |
| 6,808,965 | B1 | 10/2004 | Miyasaka et al. | |
| 6,849,872 | B1 | 2/2005 | Yamazaki | |
| 6,867,431 | B2 | 3/2005 | Konuma | |
| 6,875,633 | B2 | 4/2005 | Fukunaga | |
| 6,882,018 | B2 | 4/2005 | Ohtani | |
| 7,023,052 | B2 | 4/2006 | Yamazaki et al. | |
| 7,126,102 | B2 | 10/2006 | Inoue et al. | |
| 7,138,658 | B2 | 11/2006 | Yamazaki et al. | |
| 7,148,119 | B1 | 12/2006 | Sakaguchi et al. | |
| RE39,484 | E | 2/2007 | Bruel | |
| 7,172,929 | B2 | 2/2007 | Yamazaki et al. | |
| 7,176,525 | B2 | 2/2007 | Fukunaga | |
| 7,199,024 | B2 | 4/2007 | Yamazaki | |
| 7,223,666 | B2 | 5/2007 | Ohtani | |
| 7,381,599 | B2 | 6/2008 | Konuma | |
| 7,473,592 | B2 | 1/2009 | Yamazaki et al. | |
| 7,473,971 | B2 | 1/2009 | Yamazaki | |
| 7,476,576 | B2 | 1/2009 | Yamazaki | |
| 7,525,158 | B2 | 4/2009 | Konuma et al. | |
| 7,569,856 | B2 | 8/2009 | Konuma et al. | |
| 7,638,805 | B2 | 12/2009 | Yamazaki et al. | |
| 7,642,598 | B2 | 1/2010 | Yamazaki et al. | |
| 2001/0019153 | A1 | 9/2001 | Sato et al. | |
| 2001/0053607 | A1 | 12/2001 | Sakaguchi et al. | |
| 2002/0109144 | A1 | 8/2002 | Yamazaki | |
| 2003/0087503 | A1 | 5/2003 | Sakaguchi et al. | |
| 2004/0104435 | A1 | 6/2004 | Ohtani | |
| 2004/0164300 | A1 | 8/2004 | Yamazaki et al. | |
| 2004/0256621 | A1 | 12/2004 | Konuma | |
| 2005/0009252 | A1 * | 1/2005 | Yamazaki et al. | 438/151 |
| 2005/0142705 | A1 | 6/2005 | Konuma | |
| 2005/0153489 | A1 | 7/2005 | Konuma | |
| 2007/0007529 | A1 | 1/2007 | Takemura | |
| 2007/0020888 | A1 | 1/2007 | Yamazaki et al. | |
| 2007/0108510 | A1 | 5/2007 | Fukunga | |
| 2007/0173000 | A1 | 7/2007 | Yamazaki | |
| 2007/0184632 | A1 * | 8/2007 | Yamazaki et al. | 438/459 |
| 2007/0210451 | A1 | 9/2007 | Ohtani et al. | |
| 2007/0252206 | A1 | 11/2007 | Yamazaki et al. | |
| 2008/0054269 | A1 | 3/2008 | Yamazaki | |
| 2008/0061301 | A1 | 3/2008 | Yamazaki | |
| 2008/0067529 | A1 | 3/2008 | Yamazaki | |
| 2008/0067596 | A1 | 3/2008 | Yamazaki | |
| 2008/0067597 | A1 | 3/2008 | Yamazaki | |
| 2008/0070335 | A1 | 3/2008 | Yamazaki | |
| 2008/0083953 | A1 | 4/2008 | Yamazaki | |
| 2008/0113487 | A1 | 5/2008 | Yamazaki | |
| 2008/0213953 | A1 | 9/2008 | Yamazaki | |
| 2008/0286941 | A1 | 11/2008 | Yamazaki | |
| 2008/0286942 | A1 | 11/2008 | Yamazaki | |
| 2008/0286956 | A1 | 11/2008 | Yamazaki | |
| 2009/0236698 | A1 | 9/2009 | Yamazaki et al. | |
| 2009/0289254 | A1 | 11/2009 | Konuma et al. | |

FOREIGN PATENT DOCUMENTS

| | | |
|---|---|---|
| EP | 0 553 852 | 8/1993 |
| EP | 0 645 802 | 3/1995 |
| EP | 0 723 286 | 7/1996 |
| EP | 0 767 486 | 4/1997 |
| EP | 0 793 263 | 9/1997 |
| EP | 1 043 768 | 10/2000 |
| EP | 1 251 556 | 10/2002 |
| EP | 1 564 799 | 8/2005 |
| EP | 1 564 800 | 8/2005 |
| JP | 63-318779 | 12/1988 |
| JP | 01-126254 | 10/1989 |
| JP | 01-264254 | 10/1989 |
| JP | 2-42725 | 2/1990 |
| JP | 02-260442 | 10/1990 |
| JP | 3-79035 | 4/1991 |
| JP | 04-206766 | 7/1992 |
| JP | 04-242958 | 8/1992 |
| JP | 04-348532 | 12/1992 |
| JP | 05-166689 | 7/1993 |
| JP | 05-211128 | 8/1993 |
| JP | 05-217994 | 8/1993 |
| JP | 05-218410 | 8/1993 |
| JP | 05-226620 | 9/1993 |
| JP | 05-315355 | 11/1993 |
| JP | 07-169974 | 7/1995 |
| JP | 7-249749 | 9/1995 |
| JP | 08-255907 | 10/1996 |
| JP | 09-008124 | 1/1997 |
| JP | 09-045882 | 2/1997 |
| JP | 09-162090 | 6/1997 |
| JP | 09-213916 | 8/1997 |
| JP | 09-260682 | 10/1997 |
| JP | 09-289166 | 11/1997 |
| JP | 09-289167 | 11/1997 |
| JP | 9-289323 | 11/1997 |
| JP | 9-293876 | 11/1997 |
| JP | 10-12889 | 1/1998 |
| JP | 10-64817 | 3/1998 |
| JP | 10-93100 | 4/1998 |
| JP | 10-125879 | 5/1998 |
| JP | 10-125881 | 5/1998 |
| JP | 10-125926 | 5/1998 |
| JP | 10-125927 | 5/1998 |
| JP | 10-133233 | 5/1998 |
| JP | 10-135350 | 5/1998 |
| JP | 10-135468 | 5/1998 |
| JP | 10-135475 | 5/1998 |
| JP | 10-209465 | 8/1998 |
| JP | 11-163363 | 6/1999 |
| JP | 2000-012864 | 1/2000 |

OTHER PUBLICATIONS

Notice of Allowance (U.S. Appl. No. 11/978,605) dated May 17, 2010.

Notice of Allowance (U.S. Appl. No. 11/978,586) dated Jun. 25, 2010.

Notice of Allowance (U.S. Appl. No. 12/216,754) dated Apr. 15, 2010.

Office Action (U.S. Application No. 12/428,497) dated Jul. 16, 2010.

Office Action (U.S. Appl. No. 11/978,610) dated Apr. 27, 2010.

"Silicon or Silica" Mineral Information Institute, www.mii.org, retrieved from http://www.mii.org/Minerals/photosil.html on Apr. 14, 2010, 3 pages.

Office Action (U.S. Appl. No. 11/978,609) dated Apr. 29, 2010.

Office Action (U.S. Appl. No. 11/716,583) dated Jun. 15, 2010.

Office Action (U.S. Appl. No. 11/978,612) dated Jun. 15, 2010.

Office Action (U.S. Appl. No. 12/216,756) dated Jul. 9, 2010.

Office Action (U.S. Appl. No. 12/418,245) dated May 14, 2010.

Office Action (U.S. Appl. No. 11/978,586) dated Feb. 9, 2010.

Office Action (U.S. Appl. No. 11/978,609) dated Dec.18, 2009.

Office Action (U.S. Appl. No. 12/216,756) dated Nov. 24, 2009.

Office Action (U.S. Appl. No. 11/926,598) dated Dec. 3, 2009.
Office Action (U.S. Appl. No. 12/418,280) dated Dec. 16, 2009.
Office Action (Application No. 2007–024645) dated Dec. 8, 2009.
Office Action (U.S. Appl. No. 11/234,963) dated Dec.8, 2009.
Office Action (U.S. Appl. No. 11/926,520) dated Feb. 26, 2009, 28 pages.
Office Action (U.S. Appl. No. 11/926,598) dated May 22, 2009, 26 pages.
Office Action (U.S. Appl. No. 11/926,623) dated Jun. 25, 2008, 16 pages.
Office Action (U.S. Appl. No. 11/926,623) dated Dec. 12, 2008, 23 pages.
Office Action (U.S. Appl. No. 11/926,623) dated Jun. 26, 2009, 24 pages.
Office Action (U.S. Appl. No. 11/716,583) dated Sep. 5, 2008, 18 pages.
Office Action (U.S. Appl. No. 11/978,586) dated May 29, 2009, 31 pages.
Office Action (U.S. Appl. No. 11/978,605) dated Dec. 31, 2008, 23 pages.
Office Action (U.S. Appl. No. 11/978,609) dated May 29, 2009, 23 pages.
Office Action (U.S. Appl. No. 11/978,610) dated Oct. 7, 2009, 32 pages.
Office Action (U.S. Appl. No. 12/216,754) dated Apr. 9, 2009, 23 pages.
Office Action (Japanese Patent Application No. 10–174482) dated Feb. 5,2009, with full English Translation, 2 pages.
Office Action (Japanese Patent Application No. 2009–190690) dated Oct. 6, 2009, with full English Translation, 8 pages.
Office Action (Japanese Patent Application No. 2009–190694) dated Oct. 6, 2009, with full English Translation, 10 pages.
Office Action (Japanese Patent Application No. 10–174482) dated Jul. 15, 2008, with full English Translation, 6 pages.
Office Action (Japanese Patent Application No. 10–174482) dated Oct. 7, 2008, with full English Translation, 7 pages.
Office Action (Japanese Patent Application No. 10–174482) dated Feb. 5, 2009, with full English Translation, 2 pages.
Office Action (Japanese Patent Application No. 2007–024310) dated Jan. 20, 2009, with full English Translation, 7 pages.
Office Action (U.S. Appl. No. 11/670,462) dated May 8, 2009.
Izumi, K. et al, "C.M.O.S. Devices Fabricated on Buried SiO.sub.2 Layer Formed by Oxygen Implantation into Silicon," Electronics Letters, vol. 14, No.18, Aug. 31, 1978, pp. 593–594.
Sakaguchi, K. et al, "Current Progress in Epitaxial Layer Transfer (ELTRAN)," IEICE Trans. Electron, vol. E80 C, No. 3, Mar. 1997, pp. 378–387.
Auberton–Herve, A.J. et al, "Industrial Research Society (Kogyo Chosa Kai)," Electronic Material, Aug. 1997, pp. 83–87.
Bell, T.E. et al, "A Dissolved Wafer Process Using a Porous Silicon Sacrificial Layer and a Lightly–Doped Bulk Silicon Etch–Stop," IEEE, 1998, pp. 251–256.
Auberton–Herve, A.J. et al, "Unibond SOI Wafer by Smart Cut," Industral Research Society (Kogyo Chosa Kai), Electronic Material, Aug. 1997, full English translation, pp.1–12.
U.S. Appl. No. 11/978,610, filed Oct. 30, 2007, including specification, claims, abstract and drawings, cited by other.
Bruel, M., "Silicon on Insulator Material Technology," Electronics Letters, vol. 31, No. 14, Jul. 6, 1995, pp. 1201–1202.
Wolf, S., Silicon Processing for the VLSI Era, vol. 2: Process Integration, Lattice Press, 1990, pp. 238–239.
Office Action dated Jun. 9, 2008, from U.S. Appl. No. 11/978,605 (20 pages).
Assaderaghi et al., "A 7.9/5.5 psec Room/Low Temperature SOI CMOS," International Electron Devices Meeting, Dec. 7, 1997, pp. 415–418.
Chau et al., "Scalability of Partially Depleted SOI Technology for Sub–0.25 μm Logic Applications," International Electron Devices Meeting, Dec. 7, 1997, pp.591–594.
Ishiyama et al., "Application of Reversed Silicon Wafer Direct Bonding to Thin–Film SOI Power Ics," the 1997 International Conference on Solid State Devices and Materials, Sep. 16, 1997, pp.162–163.
Nandakumar et al. "Shallow Trench Isolation for advanced ULSI CMOS Technologies," International Electron Devices Meeting, Dec. 6, 1998, pp. 133–136.
Office Action (U.S. Appl. No. 11/926,623) dated Aug. 20, 2010.
Office Action (U.S. Appl. No. 12/418,280) dated May 13, 2010.
Notice of Allowance (U.S. Appl. No. 12/418,245) dated Nov. 26, 2010.
Office Action (US appl. No. 12/216,755) dated Sep. 16, 2010.
Office Action ( U.S. Appl. No. 12/418,245) dated Sep. 22, 2010.
Office Action (U.S. Appl. No. 11/978,610) dated Sep. 22, 2010.
* cited by examiner

METHOD OF FABRICATING A SEMICONDUCTOR DEVICE

Matter enclosed in heavy brackets [ ] appears in the original patent but forms no part of this reissue specification; matter printed in italics indicates the additions made by reissue.

*CROSS-REFERENCE TO RELATED APPLICATIONS*

This application is a *Reissue application of U.S. application Ser. No. 11/926,573, filed Oct. 29, 2007, now U.S. Pat. No. 7,473,592, issued Jan. 6, 2009, which is a* continuation of [copending] U.S. application Ser. No. 11/731,415, filed Mar. 30, 2007*, now U.S. Pat. No.* 7,473,971, issued Jan. 6, 2009, which is a continuation of U.S. application Ser. No. 10/914,357, filed [on] Aug. 9, 2004*, now U.S. Pat. No. 7,476, 576, issued Jan. 13, 2009,* which is a continuation of U.S. application Ser. No. 09/808,162, filed [on] Mar. 13, 2001, [(] now U.S. Pat. No. 6,803,264, issued Oct. 12, 2004[)], which is a divisional of U.S. application Ser. No. 09/386,782, filed [on] Aug. 31, 1999, [(] now U.S. Pat. No. 6,335,231, issued Jan. 1, 2002[)]*, and claims the benefit of a foreign priority application filed in Japan as Serial No. 10-251635 on Sep. 4, 1998. This application claims priority to each of these prior applications, and the disclosures of the prior applications are considered part of* (*and are incorporated by reference in*) *the disclosure of this application.*

BACKGROUND OF THE INVENTION

1. Field of the Invention

The present invention relates to a semiconductor device fabricated by using an SOI (Silicon on Insulator) substrate and a method of fabricating the same. Specifically, the invention relates to a semiconductor device including a thin film transistor (hereinafter referred to as TFT) formed on an SOI substrate.

Incidentally, in the present specification, the semiconductor device indicates any device capable of functioning by using semiconductor characteristics. Thus, the semiconductor device includes not only a TFT but also an electro-optical device typified by a liquid crystal display device or a photoelectric conversion device, a semiconductor circuit in which TFTs are integrated, and an electronic equipment containing such an electro-optical device or a semiconductor circuit as a part.

2. Description of the Related Art

In recent years, VLSI techniques have been remarkably developed, and attention has been paid to an SOI (Silicon on Insulator) structure for realizing low power consumption. This technique is such a technique that an active region (channel formation region) of an FET, which has been conventionally formed of bulk single crystal silicon, is made thin film single crystal silicon.

In an SOI substrate, a buried oxide film made of silicon oxide exists on single crystal silicon, and a single crystal silicon thin film is formed thereon. Various methods of fabricating such SOI substrates are known. As a typical SOI substrate, an SIMOX substrate is known. The term SIMOX is an abbreviation for Separation-by-Implanted Oxygen, and oxygen is ion implanted into a single crystal silicon substrate to form a buried oxide layer. The details of the SIMOX substrate are disclosed in [K. Izumi, M. Docken and H. Ariyoshi: "C.M.O.S. devices fabrication on buried $SiO_2$ layers formed by oxygen implantation into silicon", Electron. Lett., 14, 593–594 (1978)].

Recently, attention has also been paid to a bonded SOI substrate. The bonded SOI substrate realizes the SOI structure by bonding two silicon substrates as suggested by its name. If this technique is used, a single crystal silicon thin film can be formed also on a ceramic substrate or the like.

Among the bonded SOI substrates, in recent years, attention has been especially paid to a technique called ELTRAN (registered trademark by Canon K.K.). This technique is a method of fabricating an SOI substrate using selective etching of a porous silicon layer. The particular technique of the ELTRAN method is disclosed in, K. Sakaguchi et al., "Current Progress in Epitaxial Layer Transfer (ELTRAN)", IEICE TRANS. ELECTRON. Vol. E80 C. No. 3 pp. 378–387 March 1997, in detail.

As another SOI technique attracting attention, there is a technique called Smart-Cut (registered trademark of SOITEC Co.). The Smart-Cut method is a technique developed by SOITEC Co. in France in 1996, and is a method of fabricating a bonded SOI substrate using hydrogen embrittlement. The particular technique of the Smart-Cut method is disclosed in "Industrial Research Society (Kogyo Chosa Kai); Electronic Material, August, pp. 83–87, 1977" in detail.

When the foregoing SOI substrate is fabricated, a single crystal silicon substrate having a main surface of a crystal face of a {100} plane (crystal orientation is <100> orientation) has been used in any technique. The reason is that the {100} plane has lowest interface state density (Qss) and is suitable for a field effect transistor that is sensitive to interface characteristics.

However, with respect to the SOI substrate used for a TFT, since a single crystal silicon thin film must be formed on an insulating layer, higher priority must be given to adhesion to the insulating layer than the interface state density. That is, even if the interface state density is low, it is meaningless if the single crystal silicon thin film peels off.

SUMMARY OF THE INVENTION

The present invention has been made in view of such problems, and an object thereof is to provide a semiconductor device with high reliability by fabricating an SOI substrate suitable for a TFT and by forming TFTs on the substrate.

The structure of the present invention disclosed in the present specification is characterized by comprising the steps of:

forming a hydrogen-containing layer at a predetermined depth in a single crystal semiconductor substrate having a main surface of a {110} plane;

bonding the single crystal semiconductor substrate and a supporting substrate to each other;

splitting the single crystal semiconductor substrate by a first heat treatment along the hydrogen-containing layer;

carrying out a second heat treatment at a temperature of 900 to 1200° C.;

grinding a single crystal semiconductor layer remaining on the supporting substrate and having a main surface of a {110} plane; and forming a plurality of TFTs each having an active layer of the single crystal semiconductor layer.

Further, another structure of the present invention is characterized by comprising the steps of:

forming a porous semiconductor layer by anodization of a single crystal semiconductor substrate having a main surface of a {110} plane;

carrying out a heat treatment to the porous semiconductor layer in a reducing atmosphere;

carrying out epitaxial growth of a single crystal semiconductor layer having a main surface of a {110} plane on the porous semiconductor layer;

bonding the single crystal semiconductor substrate and a supporting substrate to each other;

carrying out a heat treatment at a temperature of 900 to 1200° C.;

grinding the single crystal semiconductor substrate until the porous semiconductor layer is exposed;

removing the porous semiconductor layer to expose the single crystal semiconductor layer; and forming a plurality of TFTs each having an active layer of the single crystal semiconductor layer on the supporting substrate.

Still further, another structure of the present invention is characterized by comprising the steps of:

forming an oxygen-containing layer at a predetermined depth in a single crystal semiconductor substrate having a main surface of a {110} plane;

changing the oxygen-containing layer into a buried insulating layer by a heat treatment; and forming a plurality of TFTs each having an active layer of a single crystal semiconductor layer having a main surface of a {110} plane on the buried insulating layer.

DETAILED DESCRIPTION OF THE PREFERRED EMBODIMENTS

The gist of the present invention is to use a single crystal semiconductor substrate having a main surface of a {110} plane (crystal face is a {110} plane) as a forming material of a single crystal semiconductor layer finally formed on a supporting substrate when an SOI substrate is fabricated by using an SOI technique such as SIMOX. ELTRAN, or Smart-Cut.

Incidentally, although the semiconductor mentioned here typically indicates silicon, the term also includes other semiconductors such as silicon germanium.

The reason why a single crystal semiconductor substrate having a main surface of a {110} plane is used as a forming material of a single crystal semiconductor layer will be described below. Incidentally, this description will be made using single crystal silicon as an example.

As single crystal silicon, although that formed by an FZ method and that formed by a CZ method exist, in the present invention, it is preferable to use single crystal silicon formed by the FZ method. In the CZ method which is the main stream at present, oxygen of about $2\times10^{18}$ atoms/cm$^5$ is contained for the purpose of relieving stress, so that there is a fear that an electron or hole mobility is lowered. Particularly, in the case where a minute TFT is formed, this comes to appear remarkably.

However, in the case where single crystal silicon is used for the SOI substrate as in the present invention, since there are many cases where the thickness of a single crystal silicon layer required for an active layer of a TFT is as very thin as 10 to 50 nm, it is not quite necessary to take stress into consideration. Thus, even if the FZ method (oxygen content is $1\times10^{17}$ atoms/cm$^3$ or less), which can form single crystal silicon more inexpensively than the inexpensive CZ method, is used, satisfactory effects can be obtained.

In a general SOI substrate, a single crystal silicon layer is formed on a silicon oxide film. Thus, adhesion and conformity between the silicon oxide layer and the single crystal silicon layer become important. From such a viewpoint, in the SOI substrate, when the single crystal silicon layer comes in contact with the silicon oxide layer, it is ideal that the contact of the single crystal silicon layer is realized with the most stable plane.

The plane which is in contact with the silicon oxide layer with most stably is a {110} plane. Because, in the case of the {110} plane, the plane is in contact with the silicon oxide layer through three silicon atoms. This state will be explained with reference to photographs shown in FIGS. 9A and 9B.

Figure 9A:
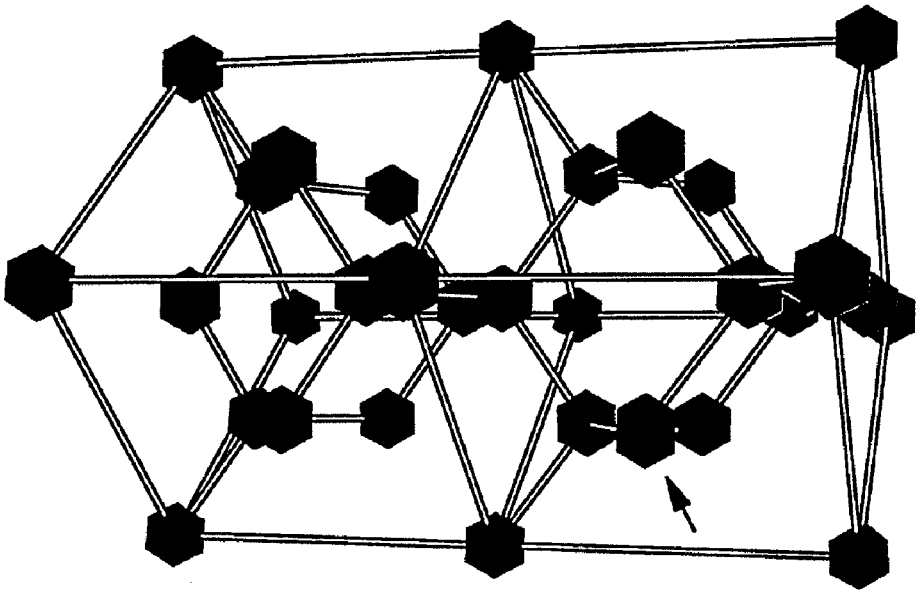
FIGS. 9A and 9B are photographs showing a crystal structure of single crystal silicon of the present invention.

FIG. 9A is a photograph of a crystal structure model showing the state where two unit lattices of single crystal silicon are placed side by side. Here, a noticeable point is a portion indicated by an arrow in the drawing. In the portion indicated by the arrow, three silicon atoms are placed side by side. Any of the three silicon atoms is contained in a plane of the {110} plane.

That is, when a single crystal silicon layer having a crystal face of the {110} plane is formed on an insulating layer, it is understood that the number of silicon atoms coming in contact with the insulating layer is three.

Figure 9B:
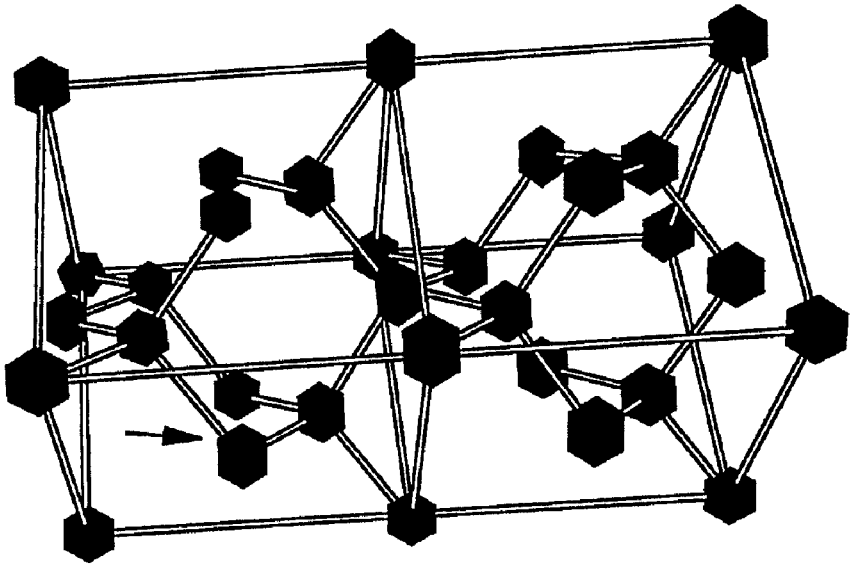

FIG. 9B is a photograph showing the state of FIG. 9A seen in a different angle. In FIG. 9B, although three silicon atoms exist in a portion indicated by an arrow, these are the same as the three silicon atoms indicated by the arrow in FIG. 9A.

Like this, it is understood that three silicon atoms are contained in the {110} plane, and are adjacently arranged in a substantially triangular shape. That is, in such an arrangement state, the single crystal silicon layer is in contact with an insulating layer as an under layer, and forms stable contact which is realized through "surface". This indicates that the single crystal silicon layer is in contact with the insulating layer as an under layer with very high adhesion.

On the other hand, in the case where the single crystal silicon comes in contact with the silicon oxide layer through another plane, for example, a {100} plane or a {111} plane, the number of silicon atoms coming in contact with the silicon oxide layer is at most two, and unstable contact is formed in which the contact is realized through "line".

Further, as a great merit of using the single crystal silicon layer having the main surface of the {110} plane, it is possible to mention that a silicon surface is very flat. In the case where the main surface is the {110} plane, a cleavage plane appears lamellarly, and it is possible to form a surface with very few asperities.

Like this, in the present invention, first priority is given to adhesion of a single crystal silicon layer to an under layer (silicon oxide layer) in the SOI substrate, and the invention is characterized by using the single crystal silicon substrate having the crystal face of the {110} plane which has not been conventionally used. That is, the invention is characterized in that the single crystal semiconductor substrate having the main surface (crystal face) of the {110} plane is used as a material, and the SOI technique such as SIMOX, ELTRAN, or Smart-Cut is fully used, so that the SOI substrate with high reliability is formed. Incidentally, an oriental flat of the single crystal semiconductor substrate having the main surface of the {110} plane may be made a {111} plane.

Then such an SOI substrate is used, and a plurality of TFTs each having an active layer of a single crystal semiconductor thin film are formed on the same substrate, so that a semiconductor device having high reliability can be realized.

The present invention will next be described in detail with preferred embodiments described below.

Embodiment 1

In this embodiment, with reference to FIGS. 1A to 1F and 2A to 2E, a description will be made on a case where when an SOI substrate is fabricated by a Smart-Cut method, a single crystal silicon substrate having a main surface of a {110} plane is used, and a semiconductor device is fabricated by using the SOI substrate.

First, a single crystal silicon substrate 101 as a forming material of a single crystal silicon layer is prepared. Here, although a P-type substrate having a main surface of a crystal face of a {110} plane is used, an N-type substrate may be used. Of course, a single crystal silicon germanium substrate may be used.

Figure 1A:
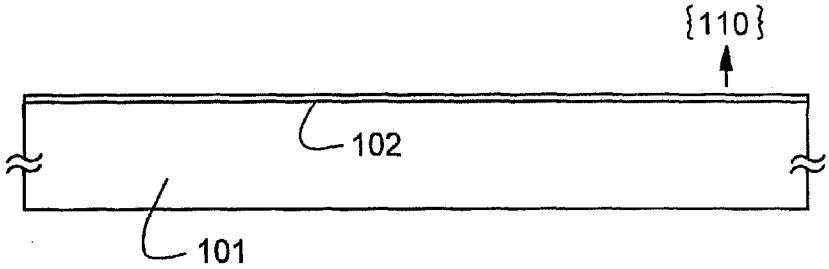
FIGS. 1A to 1F are views showing fabricating steps of an SOI substrate of Embodiment 1.

Next, a thermal oxidation treatment is carried out, so that a silicon oxide film 102 is formed on the main surface (corresponding to an element forming surface). Although a film thickness may be suitably determined by a user, the thickness is made 10 to 500 nm (typically 20 to 50 nm). This silicon oxide film 102 functions later as a part of a buried insulating layer of an SOI substrate (FIG. 1A).

At this time, the adhesion between the single crystal silicon substrate 101 and the silicon oxide film 102 becomes very high. Because, the silicon oxide film 102 is formed on the {110} plane in this invention, so that an interface with very high conformity can be realized. Since this interface is an interface between an active layer and an under film in a final TFT, it is very advantageous that the adhesion (conformity) is high.

The reason why the thickness of the silicon oxide film 102 can be made as thin as 20 to 50 nm is that the crystal face of the single crystal silicon substrate 101 has the {110} plane, so that the silicon oxide film having high adhesion can be formed even though it is thin.

Incidentally, the {110} plane has a problem that when an oxidation reaction proceeds, undulation (asperity) of the silicon surface gradually becomes large. However, in the case where a thin silicon oxide film is provided as in this embodiment, since the amount of oxidation is small, a problem of such undulation can be eliminated to the utmost. This is an advantage that is common to all embodiments disclosed in the present specification.

Thus, the single crystal silicon layer formed by using this invention has a very flat surface. For example, a distance between the top and top of the undulation is 10 times or less (preferably 20 times or less) as long as a distance between adjacent atoms of the three atoms contained in the {110} plane. That is, it is about 5 nm or less (preferably 10 nm or less).

Figure 1B:
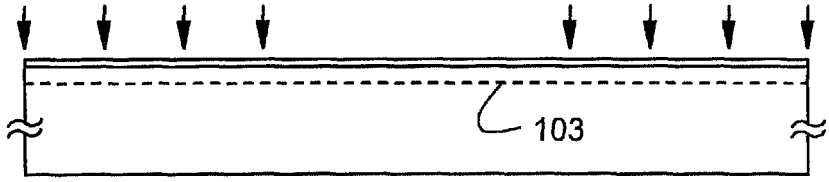

Next, hydrogen is added through the silicon oxide film 102 from the side of the main surface of the single crystal silicon substrate 101. In this case, the hydrogen addition may be carried out as the form of hydrogen ions using an ion implantation method. Of course, the addition step of hydrogen may be carried out by other means. In this way, a hydrogen-containing layer 103 is formed. In this embodiment, a hydrogen ion with a dosage of $1\times10^{16}$ to $1\times10^{17}$ atom/cm$^2$ is added (FIG. 1B).

Since the depth where the hydrogen-containing layer is formed determines the thickness of the single crystal; silicon layer later, precise control is required. In this embodiment, control of a hydrogen addition profile in the depth direction is made so that the single crystal silicon layer with a thickness of 50 nm remains between the main surface of the single crystal silicon substrate 101 and the hydrogen-containing layer 103.

Since the {110} plane is a plane which has the lowest atomic density, even if hydrogen ions are added, a probability of collision with silicon atoms is lowest. That is, it is possible to suppress damage at the time of ion addition to the minimum.

Figure 1C:
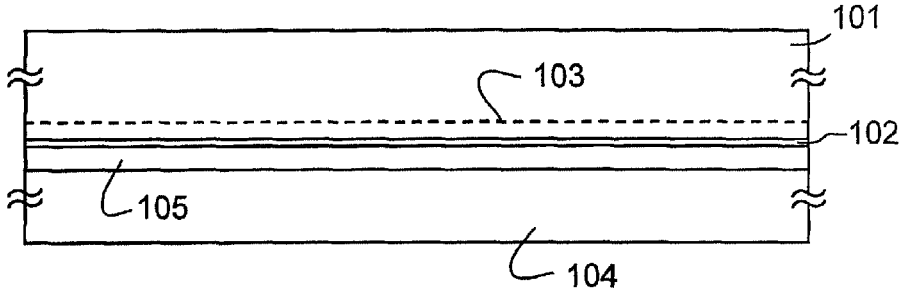

Next, the single crystal silicon substrate 101 and a supporting substrate are bonded to each other. In this embodiment, a silicon substrate 104 is used as the supporting substrate, and a silicon oxide film 105 for bonding is provided on its surface. As the silicon substrate 104, it is satisfactory if an inexpensive silicon substrate formed by the FZ method is prepared. Of course, it does not matter if a polycrystal silicon substrate is used. Besides, if only flatness can be assured, a highly refractory substrate such as a quartz substrate, a ceramic substrate, or a crystallized glass substrate may be used (FIG. 1C).

At this time, since a bonding interface is formed of highly hydrophilic silicon oxide films, they are adhered to each other with hydrogen bonds by reaction of moisture contained in both the surfaces.

Figure 1D:
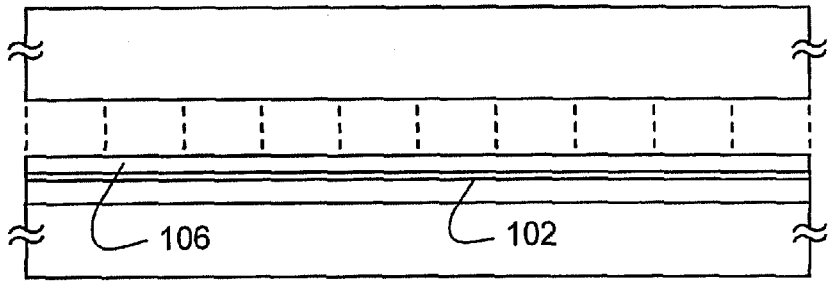

Next, a heat treatment (first heat treatment) at 400 to 600° C. (typically 500° C.) is carried out. By this heat treatment, in the hydrogen-containing layer 103, a volume change of a minute vacancy occurs, and a broken surface is produced along the hydrogen-containing layer 103. By this, the single crystal silicon substrate 101 is split, so that the silicon oxide film 102 and a single crystal silicon layer 106 are made to remain on the supporting substrate (FIG. 1D).

Next, as a second heat treatment, a furnace annealing step is carried out in a temperature range of 1050 to 1150° C. In this step, at the bonded interface, stress relaxation of Si—O— Si bonds occurs, so that the bonded interface becomes stable. That is, this becomes a step of completely bonding the single crystal silicon layer 106 to the supporting substrate. In this embodiment, this step is carried out at 1100° C. for 2 hours.

Figure 1E:
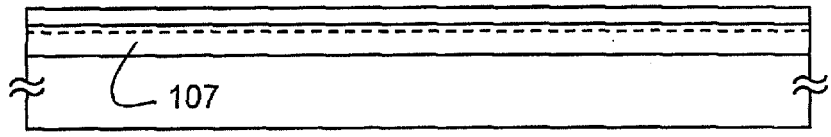

The bonded interface is stabilized in this way, so that a buried insulating layer 107 is defined. In FIG. 1E, a dotted line in the buried insulating layer 107 indicates the bonded interface, and means that adhesion of the interface has become strong.

Next, the surface of the single crystal silicon layer 106 is flattened. For flattening, a polishing step called CMP (Chemical Mechanical Polishing) or a furnace annealing treatment at high temperature (about 900 to 1200° C.) in a reducing atmosphere may be carried out.

The final thickness of the single crystal silicon layer 106 may be made 10 to 200 nm (preferably 20 to 100 nm).

Figure 1F:
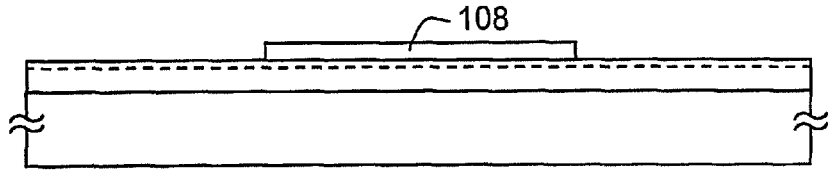

Next, the single crystal silicon layer 106 is patterned to form an island-like silicon layer 108 which becomes an active layer of a TFT. In this embodiment, although only one island-like silicon layer is shown, a plurality of layers are formed on the same substrate (FIG. 1F).

In the manner as described above, the island-like silicon layer 108 having the main surface of the {110} plane is obtained. The present invention is characterized in that the island-like silicon layer obtained in this way is used as an active layer of a TFT, and a plurality of TFTs are formed on the same substrate.

Figure 2A:
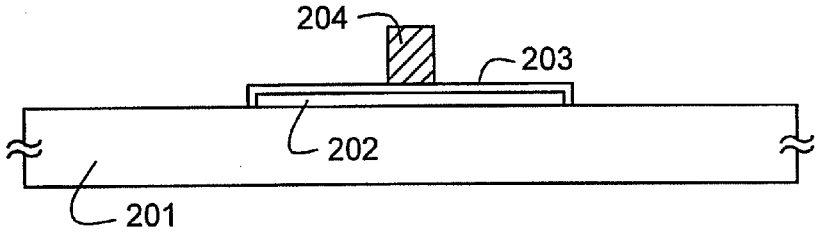
FIGS. 2A to 2E are views showing fabricating steps of a TFT of Embodiment 1.

Next, a method of forming a TFT will be described with reference to FIGS. 2A to 2E. First, steps up to the state of FIG. 1F are completed. In FIG. 2A, although a supporting substrate 201 is actually divided into the silicon substrate 104 and the buried insulating layer 107 in FIG. 1, they are shown in an integrated state for simplicity. An island-like silicon layer 202 of FIG. 2A corresponds to the island-like silicon layer 108 of FIG. 1F.

Next, a thermal oxidation step is carried out so that a silicon oxide film 203 with a thickness of 10 nm is formed on the surface of the island-like silicon layer 202. This silicon oxide film 203 functions as a gate insulating film. After the gate insulating film 203 is formed, a polysilicon film having conductivity is formed thereon, and a gate wiring line 204 is formed by patterning (FIG. 2A).

Incidentally, in this embodiment, although the polysilicon film having N-type conductivity is used as the gate wiring line, the material is not limited to this. Particularly, for the purpose of decreasing the resistance of the gate wiring line, it is also effective to use a metal material such as tantalum, tantalum alloy, or a laminate film of tantalum and tantalum nitride. Moreover, for the purpose of obtaining the gate wiring line with further low resistance, it is also effective to use copper or copper alloy.

After the state of FIG. 2A is obtained, an impurity to give N-type conductivity or P-type conductivity is added to form an impurity region 205. The impurity concentration at this time determines the impurity concentration of an LDD region later. In this embodiment, although arsenic with a concentration of $1\times10^{18}$ atoms/cm$^3$ is added, neither an impurity nor a concentration is not required to be limited to this embodiment.

Next, a thin silicon oxide film 206 with a thickness of about 5 to 10 nm is formed on the surface of the gate wiring line. This may be formed by using a thermal oxidation method or a plasma oxidation method. The formation of the silicon oxide film 206 has an object to make it function as an etching stopper in a next side wall forming step.

Figure 2B:
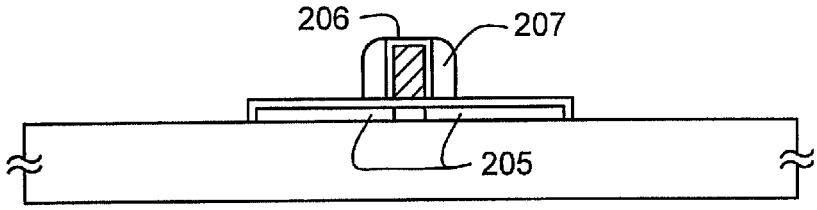

After the silicon oxide film 206 as an etching stopper is formed, a silicon nitride film is formed and etch back is carried out, so that a side wall 207 is formed. In this way, the state of FIG. 2B is obtained.

In this embodiment, although the silicon nitride film is used as the side wall 207, a polysilicon film or an amorphous silicon film may be used. Of course, it is needless to say that if the material of the gate wiring line is changed, room for choice of a material which can be used as the side wall is widened.

Figure 2C:
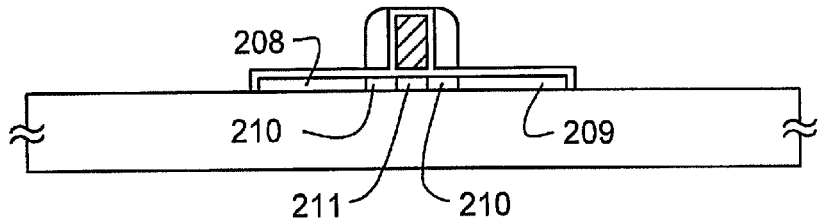

Next, an impurity having the same conductivity as the former step is added again. The concentration of the impurity added at this time is made higher than that at the former step. In this embodiment, arsenic is used as the impurity, and the concentration is made $1\times10^{21}$ atoms/cm$^3$. However, it is not necessary to make limitation to this. By the addition step of the impurity, a source region 208, a drain region 209, an LDD region 210, and a channel formation region 211 are defined (FIG. 2C).

In this way, after the respective impurity regions are formed, activation of the impurity is carried out by furnace annealing, laser annealing, lamp annealing, or the like.

Figure 2D:
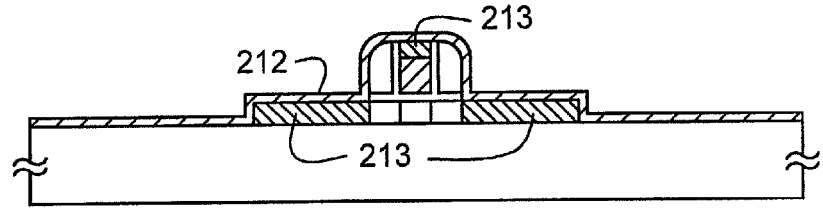

Next, silicon oxide films formed on the surfaces of the gate wiring line 204, the source region 208, and the drain region 209 are removed to expose their surfaces. Then a cobalt film 212 with a thickness of about 5 nm is formed and a thermal treatment step is carried out. By this heat treatment, a reaction of cobalt and silicon occurs, so that a silicide layer (cobalt silicide layer) 213 is formed (FIG. 2D).

This technique is a well-known salicide technique. Thus, it does not matter if titanium or tungsten is used instead of cobalt, and a heat treatment condition and the like may be referred to me well-known technique. In this embodiment, the heat treatment step is carried out by using lamp annealing.

After the silicide layer 213 is formed in this way, the cobalt film 212 is removed. Thereafter, an interlayer insulating film 214 with a thickness of 1 μm is formed. As the interlayer insulating film 214, a silicon oxide film, a silicon nitride film, a silicon nitride oxide film, or a resin film, such as polyamide, polyimide, acryl, etc., may be used. Alternatively, these insulating films may be laminated.

Next, contact holes are formed in the interlayer insulating film 214, and a source wiring line 215 and a drain wiring line 216 made of a material containing aluminum as its main ingredient are formed. Finally, the entire component is subjected to furnace annealing at 300° C. for 2 hours in a hydrogen atmosphere, and hydrogenating is completed.

Figure 2E:
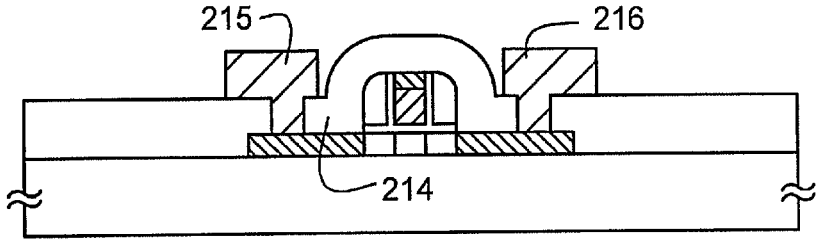

In this way, a TFT as shown in FIG. 2E is obtained. Incidentally, the structure described in this embodiment is merely an example, and a TFT structure to which the present invention can be applied is not limited to this. Thus, the invention can be applied to a TFT of any well-known structure. Besides, the step condition of this embodiment is merely an example, and a user may properly determine an optimum condition other than the essential portion of the invention.

Besides, in this embodiment, although the description has been made with the N-channel TFT as an example, it is also easy to fabricate a P-channel TFT. Further, it is also possible to form a CMOS circuit by forming an N-channel TFT and a P-channel TFT on the same substrate and by complementarily combining them.

Further, in the structure of FIG. 2E, if a pixel electrode (not shown) electrically connected to the drain wiring line 216 is formed by well-known means, it is also easy to form a pixel switching element of an active matrix type display device.

That is, the invention is also a very effective technique as a method of fabricating an electro-optical device typified by a liquid crystal display device, an EL (electroluminescence) display device, an EC (electrochromic) display device, a photoelectric conversion device (optical sensor), and the like.

Embodiment 2

In this embodiment, a description will be made of an example in which an SOI substrate different from that of embodiment 1 is fabricated by using a single crystal silicon substrate having a main surface of a {110} plane, and a semiconductor device is fabricated by using the SOI substrate using FIGS. 3A to 3F. Specifically, a case where a technique called ELTRAN is used will be described.

First, a single crystal silicon substrate 301 having a main surface (crystal face) of a {110} plane is prepared. Next, the main surface is subjected to anodization to form a porous silicon layer 302. The anodization step may be carried out in a mixed solution of hydrofluoric acid and ethanol. The porous silicon layer 302 is regarded as a single crystal silicon layer provided with columnar surface holes at a surface density of about $10^{11}$ holes/$cm^3$, and succeeds to the crystal state (orientation, etc.) of the single crystal silicon substrate 301 as it is. Incidentally, since the ELTRAN method itself is well known, the detailed description will be omitted here.

After the porous silicon layer 302 is formed, it is preferable to carry out a heat treatment step in a reducing atmosphere and within a temperature range of 900 to 1200° C. (preferably 1000 to 1150° C). In this embodiment, a heat treatment at 1050° C. for 2 hours is carried out in a hydrogen atmosphere.

As the reducing atmosphere, although a hydrogen atmosphere, an ammonia atmosphere, or an inert gas atmosphere containing hydrogen or ammonia (mixed atmosphere of hydrogen and nitrogen, or hydrogen and argon, etc.) is preferable, flattening of the surface of the crystalline silicon film can be made even in an inert gas atmosphere. However, when a reduction of a natural oxidation film is carried out by using a reducing action, many silicon atoms with high energy are generated and the flattening effect is resultantly increased. Thus, use of the reducing atmosphere is preferable.

However, attention needs to be especially paid to the point that the concentration of oxygen or an oxygen compound (for example, OH radical) contained in the atmosphere must be 10 ppm or less (preferably 1 ppm or less). Otherwise, the reducing reaction by hydrogen comes not to occur.

At this time, in the vicinity of the surface of the porous silicon layer 302, the surface holes are filled up by movement of silicon atoms, so that a very flat silicon surface can be obtained.

Figure 3A:
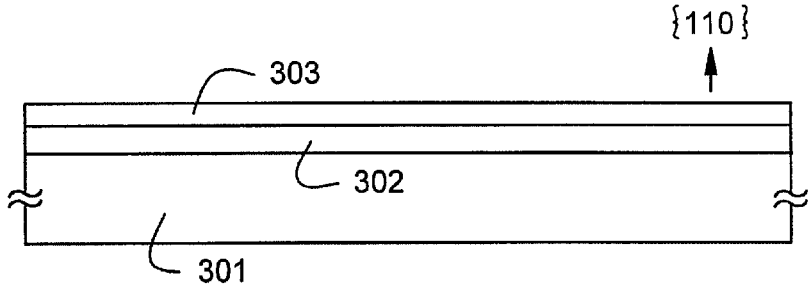
FIGS. 3A to 3F are views showing fabricating steps of an SOI substrate of Embodiment 2.

Next, a single crystal silicon layer 303 is epitaxially grown on the porous silicon layer 302. At this time, since the epitaxially grown single crystal silicon layer 303 reflects the crystal structure of the single crystal silicon substrate 301 as it is, its main surface becomes a {110} plane. The film thickness may be 10 to 200 nm (preferably 20 to 100 nm) (FIG. 3A).

Figure 3B:
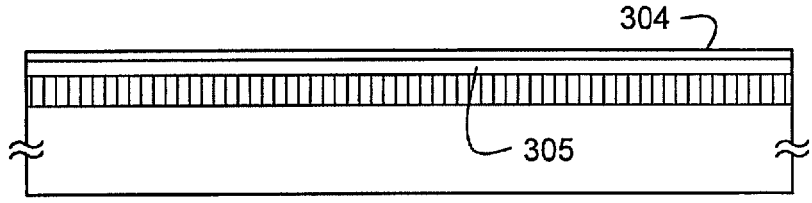

Next, the single crystal silicon layer 303 is oxidized to form a silicon oxide layer 304. As a forming method, it is possible to use thermal oxidation, plasma oxidation, laser oxidation, or the like. At this time, a single crystal silicon layer 305 remains (FIG. 3B).

Next, as a supporting substrate, a polycrystal silicon substrate 306 provided with a silicon oxide layer on its surface is prepared. Of course, a ceramic substrate, a quartz substrate, or a glass ceramic substrate each provided with an insulating film on its surface may be used.

Figure 3C:
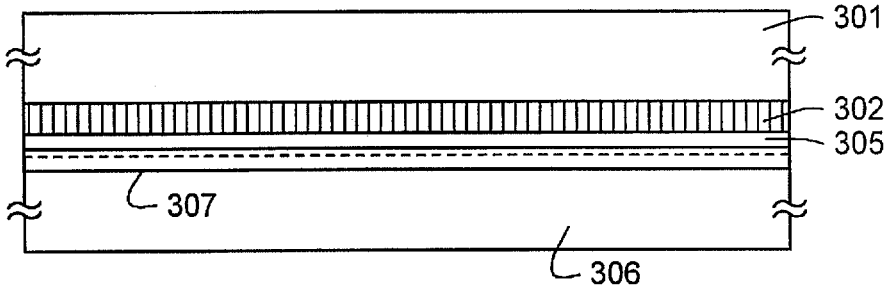

After the preparation of the single crystal silicon substrate 301 and the supporting substrate (polycrystal silicon substrate 306) is completed in this way, both of the substrates are bonded to each other in such a manner that the respective main surfaces are opposite to each other. In this case, the silicon oxide layer provided on each of the substrates functions as an adhesive (FIG. 3C).

After bonding is ended, a heat treatment step at a temperature of 1050 to 1150° C. is next carried out, and the bonded interface made of both the silicon oxide layers is stabilized. In this embodiment, this heat treatment step is carried out at 1100° C. for 2 hours. Incidentally, a portion indicated by a dotted line in FIG. 3C is the bonded interface after adhering has been completely performed. The silicon oxide layers provided on both the substrates are integrated by the heat treatment to become a buried insulating layer 307.

Figure 3D:
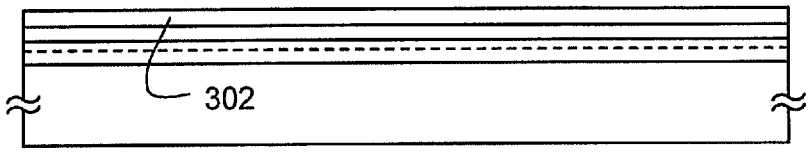

Next, the single crystal silicon substrate 301 is ground from the rear surface side by mechanical polishing such as CMP, and the grinding step is ended when the porous silicon layer 302 is exposed. In this way, the state shown in FIG. 3D is obtained.

Next, the porous silicon layer 302 is subjected to wet etching and is selectively removed. As an etchant to be used, a mixed solution of a hydrofluoric acid solution and a hydrogen peroxide solution is preferable. It is reported that a solution of a mixture of 49% HF and 30% $H_2O_2$ at a ratio of 1:5 has a selecting ratio of a hundred thousand times or more between a single crystal silicon layer and a porous silicon layer.

Figure 3E:
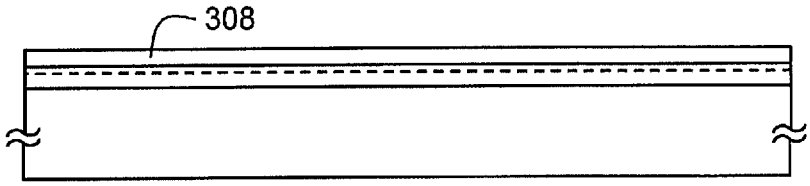
Figure 3F:
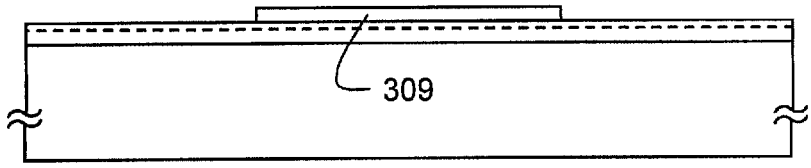

The state shown in FIG. 3E is obtained in this way. In this state, the buried insulating layer 307 is provided on the polycrystal silicon substrate 306, and a single crystal silicon layer 308 is formed thereon.

Although the SOI substrate is completed at this time, since minute asperities exist on the surface of the single crystal silicon layer 308, it is desirable to carry out a heat treatment step in a hydrogen atmosphere to perform flattening. This flattening phenomenon occurs due to speed-increasing surface diffusion of silicon atoms by reduction of a natural oxidation film.

At this time, since there is also an effect that boron contained in the single crystal silicon layer 308 (that contained in a P-type silicon substrate) is released into a vapor phase by hydrogen atoms, the heat treatment step is also effective in decrease of impurities.

Next, the obtained single crystal silicon layer 308 is patterned to form an island-like silicon layer 309. Although only one layer is shown in the drawings, it is needless to say that a plurality of island-like silicon layers may be formed.

Thereafter, a TFT can be fabricated in accordance with the same steps as those described in embodiment 1 with reference to FIGS. 2A to 2E. The TFT may be formed by other well-known means. In this embodiment, the detailed description will be omitted.

Embodiment 3

In this embodiment, a description will be made on an example in which a single crystal silicon substrate having a main surface of a {110} plane is used to fabricate an SOI substrate different from that of embodiment 1 or embodiment 2, and a semiconductor device is fabricated by using the substrate using FIGS. 4A to 4C. Specifically, a case in which an SOI substrate called SIMOX is fabricated will be described.

Figure 4A:
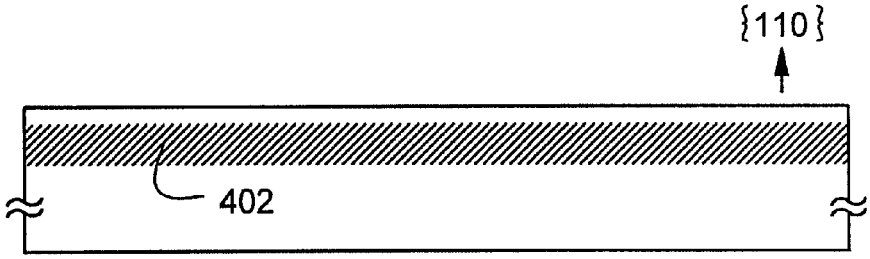
FIGS. 4A to 4C are views showing fabricating steps of an SOI substrate of Embodiment 3.
Figure 4B:
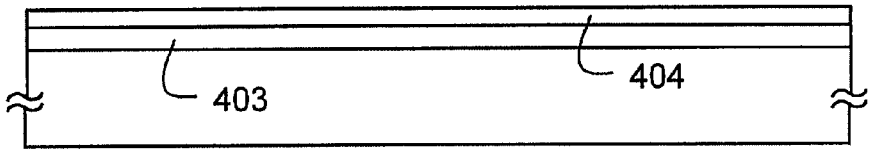
Figure 4C:
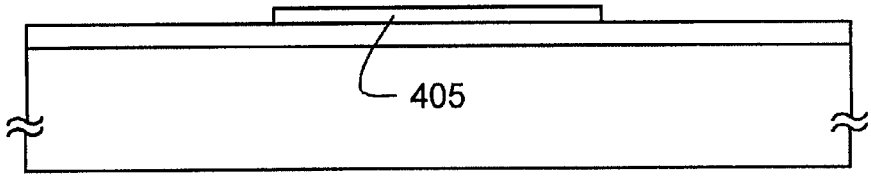

In FIG. 4A, reference numeral 401 designates a single crystal silicon substrate. In this embodiment, an oxygen ion is first added to the single crystal silicon substrate 401 to form an oxygen-containing layer 402 at a predetermined depth. The oxygen ion with a dosage of about $1\times10^{18}$ atoms/$cm^2$ may be added.

At this time, since the {110} plane has small atomic density, a probability of collision of the oxygen ion and silicon atom becomes lower. That is, it is possible to suppress damage of the silicon surface due to the addition of oxygen to the minimum. Of course, if the substrate temperature is raised at 400 to 600° C. during the ion addition, the damage can be further decreased.

Next, a heat treatment at a temperature of 800 to 1200° C. is carried out, so that the oxygen-containing layer 402 is changed into a buried insulating layer 403. The width of the oxygen-containing layer 402 in the depth direction is determined by a distribution of the oxygen ion at the ion addition, and has a distribution with a gentle tail. However, by this heat treatment, the interface between the single crystal silicon substrate 401 and the buried insulating layer 403 becomes very steep (FIG. 4B).

The thickness of this buried insulating layer 403 is 10 to 500 nm (typically 20 to 50 nm). The reason why the buried insulating layer as thin as 20 to 50 nm can be realized is that the interface between the single crystal silicon substrate 401 and the buried insulating layer 403 is stably coupled, which is the very result of the fact that the single crystal silicon substrate having the main surface of the {110} plane is used as the material of the single crystal silicon layer.

When the buried insulating layer 403 is formed in this way, a single crystal silicon layer 404 remains on the buried insulating layer 403. That is, in this embodiment, since the single crystal silicon substrate having the main surface of the {110} plane is used, the main surface (crystal face) of the single crystal silicon layer 404 obtained after the buried insulating layer is formed comes to have the {110} plane as well. Incidentally, adjustment may be made so that the thickness of the single crystal silicon layer 404 becomes 10 to 200 nm (preferably 20 to 100 nm).

After the single crystal silicon layer 404 is obtained in this way, patterning is carried out to obtain an island-like silicon layer 405. A plurality of island-like silicon layers may be formed.

Thereafter, a plurality of TFTs may be completed in accordance with the steps described in embodiment 1 using FIGS. 2A to 2E. The TFTs may be formed by other well-known means. In this embodiment, the detailed description will be omitted.

Embodiment 4

Figure 5A:
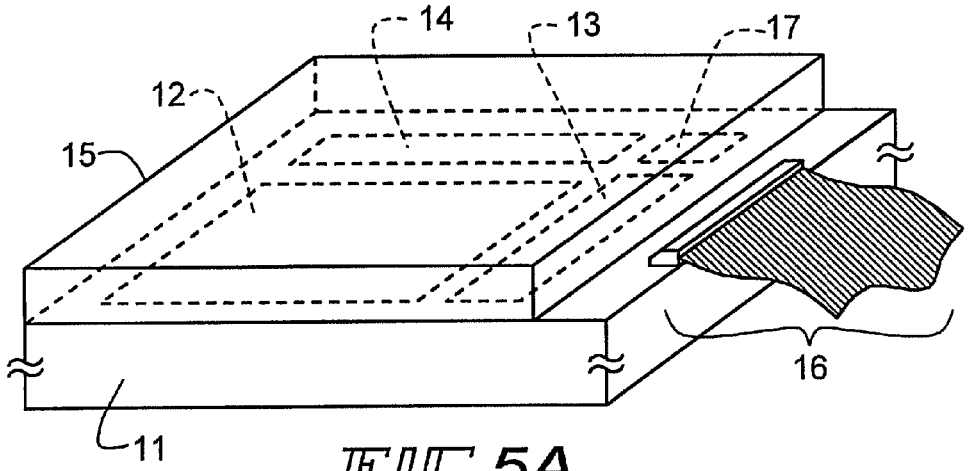
FIGS. 5A to 5C are views showing a structure of a semiconductor device (electro-optical device) of Embodiment 4.
Figure 5B:
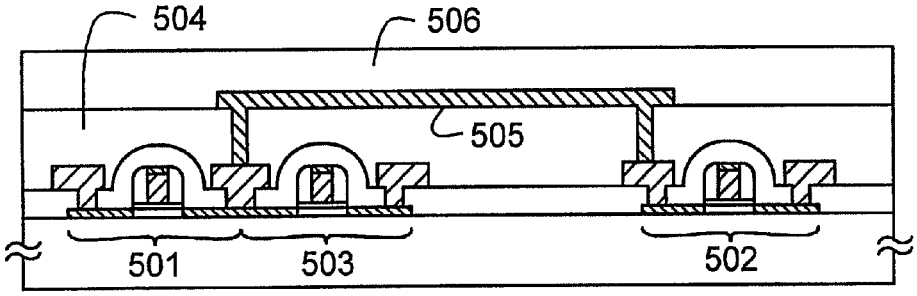
Figure 5C:
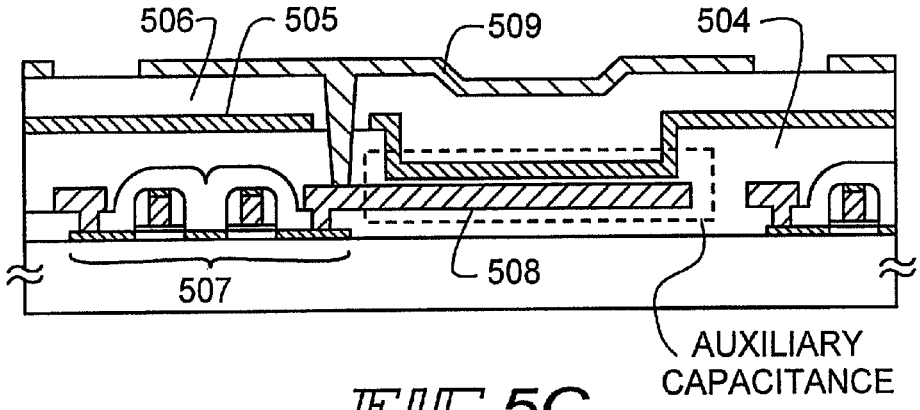

In this embodiment, an example of a reflection type liquid crystal display device as a semiconductor device of the present invention will be shown in FIGS. 5A to 5C. Since a fabricating method of a pixel TFT (pixel switching element) and a cell assembling step may be made by using well-known means, the detailed description will be omitted.

In FIG. 5A, reference numeral 11 designates a substrate having an insulating surface, 12 designates a pixel matrix circuit, 13 designates a source driver circuit, 14 designates a gate driver circuit, 15 designates an opposite substrate, 16 designates an FPC (Flexible Printed Circuit), and 17 designates a signal processing circuit. As the signal processing circuit 17, a circuit performing processing for which an IC has been conventionally substituted, such as a D/A converter, a γ-correction circuit, or a signal dividing circuit, can be formed. Of course, it is also possible to provide an IC chip on a glass substrate and to perform signal processing on the IC chip.

Further, although the description in this embodiment has been made on the liquid crystal display device as an example, it is needless to say that the present invention can be applied to an EL (electroluminescence) display device or an EC (electrochromic) display device as long as the display device is an active matrix type display device.

Here, an example of a circuit constituting the driver circuits 13 and 14 of FIG. 5A is shown in FIG. 5B. Since a TFT portion has been described in embodiment 1, only necessary portions will be described here.

In FIG. 5B, reference numerals 501 and 502 designate N-channel TFTs, 503 designates a P-channel TFT, and the TFTs 501 and 503 constitute a CMOS circuit. Reference numeral 504 designates an insulating layer made of a laminate film of a silicon nitride film/silicon oxide film/resin film, and a titanium wiring line 505 is provided thereon. The CMOS circuit and the TFT 502 are electrically connected to each other. The titanium wiring line is further covered with an insulating layer 506 made of a resin film. The two insulating films 504 and 506 also have a function as a flattening film.

A part of circuits constituting the pixel matrix circuit 12 of FIG. 5A is shown in FIG. 5C. In FIG. 5C, reference numeral 507 designates a pixel TFT made of a double gate structure N-channel TFT, and a drain wiring line 508 is formed to widely extend into a pixel region.

The insulating layer 504 is provided thereon, and the titanium wiring line 505 is provided thereon. At this time, a recess portion is formed in a part of the insulating layer 504, and only silicon nitride and silicon oxide of the lowermost layer are made to remain. By this, auxiliary capacitance is formed between the drain wiring line 508 and the titanium wiring line 505.

Besides, the titanium wiring line 505 provided in the pixel matrix circuit has an electric field shielding effect between the source/drain wiring line and a subsequent pixel electrode. Further, it also functions as a black mask at gaps between a plurality of pixel electrodes provided.

Then, the insulating layer 506 is provided to cover the titanium wiring line 505, and a pixel electrode 509 made of a reflective conductive film is formed thereon. Of course, it does not matter if contrivance to raise reflectivity may be made on the surface of the pixel electrode 509.

Actually, although an orientation film or a liquid crystal layer is provided on the pixel electrode 509, the description will be omitted here.

The reflection type liquid crystal display device having the structure as described above can be fabricated by using the present invention. Of course, when combined with a well-known technique, it is also possible to easily fabricate a transmission type liquid crystal display device. Further, when combined with a well-known technique, it is also possible to easily fabricate an active matrix type EL display device.

Embodiment 5

The present invention can be applied to all conventional IC techniques. That is the present invention can be applied to all semiconductor circuits presently available on the market. For example, the present invention may be applied to a microprocessor such as a RISC processor integrated on one chip or an ASIC processor, and may be applied to circuits from a signal processing circuit such as a D/A converter to a high frequency circuit for a portable equipment (portable telephone, PHS, mobile computer).

Figure 6:
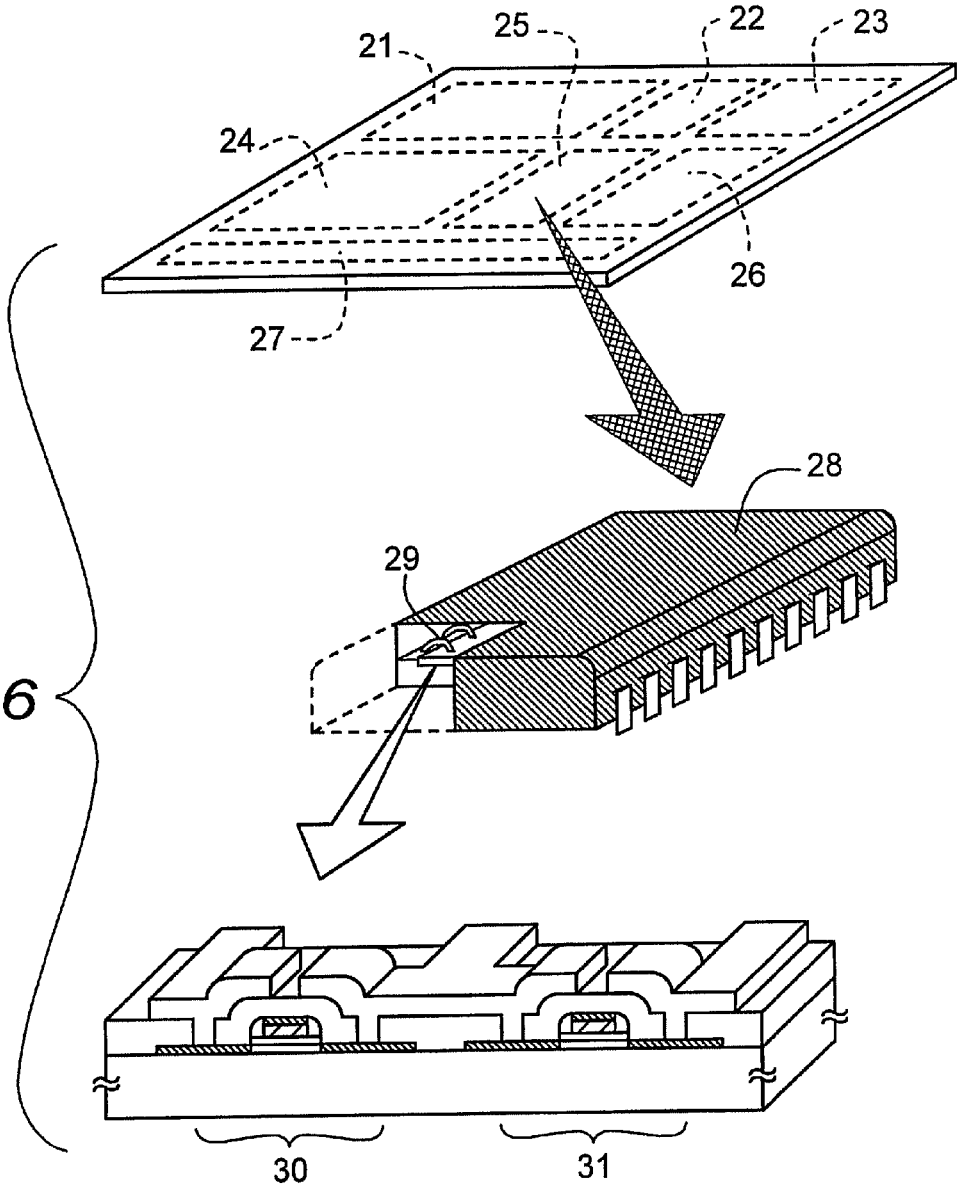
FIG. 6 is view showing a structure of a semiconductor device (semiconductor circuit) of Embodiment 5.

FIG. 6 shows an example of a microprocessor. The microprocessor is typically constituted by a CPU core 21, a RAM 22, a clock controller 23, a cache memory 24, a cache controller 25, a serial interface 26, an I/O port 27, and the like.

Of course, the microprocessor shown in FIG. 6 is a simplified example, and various circuit designs are made for actual microprocessors according to their use.

However, in any microprocessor with any function, it is an IC (Integrated Circuit) 28 that functions as a central part. The IC 28 is a functional circuit in which an integrated circuit formed on a semiconductor chip 29 is protected with ceramic or the like.

An N-channel TFT 30 and a P-channel TFT 31 having the structure of this invention constitute the integrated circuit formed on the semiconductor chip 29. Note that when a basic circuit is constituted by a CMOS circuit as a minimum unit, power consumption can be suppressed.

Besides, the microprocessor shown in this embodiment is mounted on various electronic equipments and functions as a central circuit. As typical electronic equipments, a personal computer, a portable information terminal equipment, and other all household electric appliances can be enumerated. Besides, a computer for controlling a vehicle (automobile, electric train, etc.) can also be enumerated.

Embodiment 6

A CMOS circuit and a pixel matrix circuit formed through carrying out the present invention may be applied to various electro-optical devices (active matrix type liquid crystal display devices, active matrix type EL display devices, active matrix type EC display devices). Namely, the present invention may be embodied in all the electronic equipments that incorporate those electro-optical devices as display media.

As such an electronic equipment, a video camera, a digital camera, a projector (rear-type projector or front-type projector), a head mount display (goggle-type display), a navigation system for vehicles, a personal computer, and a portable information terminal (a mobile computer, a cellular phone, or an electronic book) may be enumerated. Examples of those are shown in FIGS. 7A to 8D.

Figure 7A:
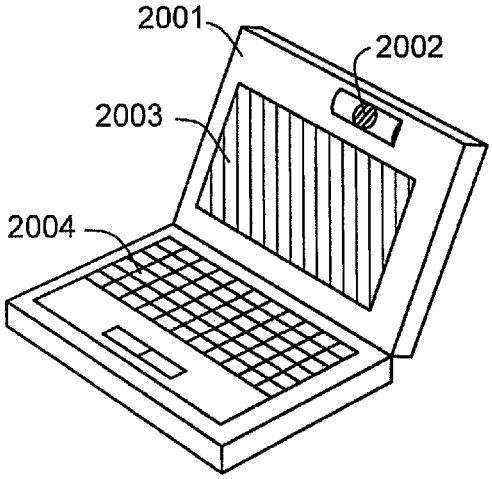
FIGS. 7A to 7F are views showing structures of semiconductor devices (electronic equipments) of Embodiment 6.

FIG. 7A shows a personal computer comprising a main body 2001, an image inputting unit 2002, a display device 2003, and a key board 2004. The present invention is applicable to the image inputting unit 2002, the display device 2003, and other signal control circuits.

Figure 7B:
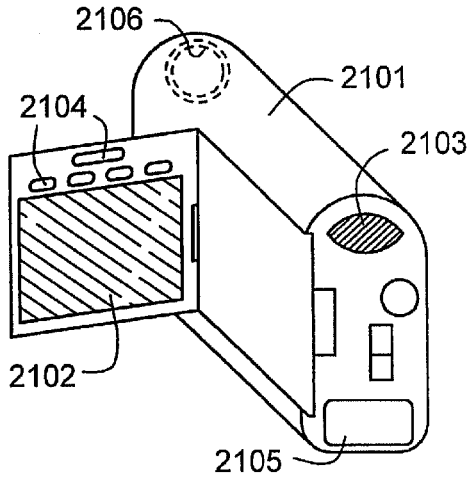

FIG. 7B shows a video camera comprising a main body 2301, a display device 2102, a voice input unit 2103, an operation switch 2104, a battery 2105, and an image receiving unit 2106. The present invention is applicable to the display device 2102, the voice input unit 2103, and other signal control circuits.

Figure 7C:
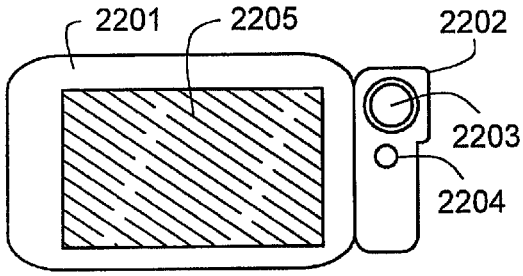

FIG. 7C shows a mobile computer comprising a main body 2201, a camera unit 2202, an image receiving unit 2203, an operation switch 2204, and a display device 2205. The present invention is applicable to the display device 2205 and other signal control circuits.

Figure 7D:
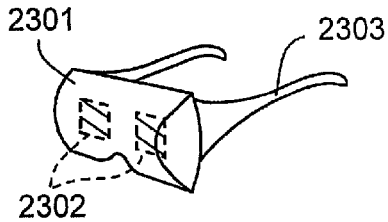

FIG. 7D shows a goggle-type display comprising a main body 2301, a display device 2302 and an arm portion 2303. The present invention is applicable to the display device 2302 and other signal control circuits.

Figure 7E:
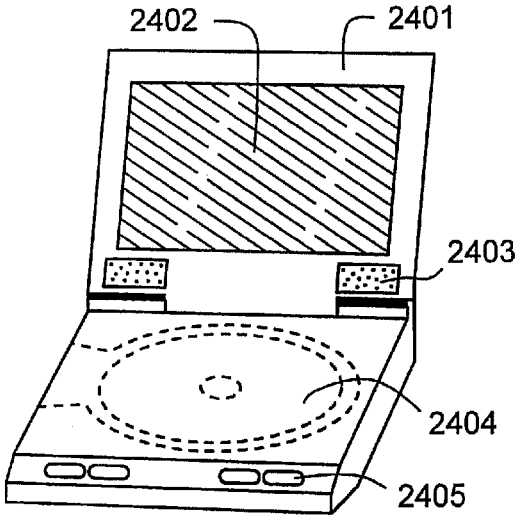

FIG. 7E shows a player that employs a recoding medium in which programs are recorded (hereinafter referred to as recording medium), and comprises a main body 2401, a display device 2402, a speaker unit 2403, a recording medium 2404, and an operation switch 2405. Incidentally, this player uses as the recoding medium a DVD (digital versatile disc), a CD and the like to serve as a tool for enjoying music or movies, for playing games and for connecting to the Internet. The present invention is applicable to the display device 2402 and other signal control circuits.

Figure 7F:
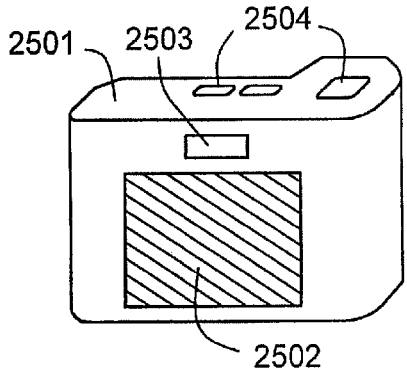

FIG. 7F shows a digital camera comprising a main body 2501, a display device 2502, an eye piece section 2503, an operation switch 2504, and an image receiving unit (not shown). The present invention is applicable to the display device 2502 and other signal control circuits.

Figure 8A:
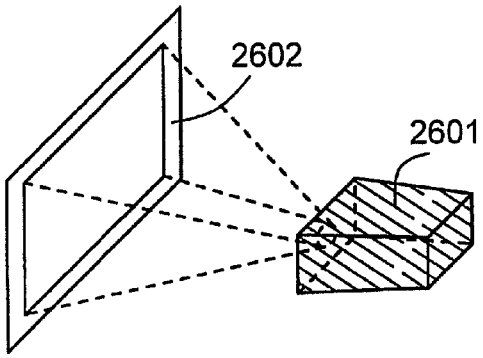
FIGS. 8A to 8D are views showing structures of semiconductor devices (electronic equipments) of Embodiment 6.

FIG. 8A shows a front-type projector comprising a display device 2601 and a screen 2602. The present invention is applicable to the display device and other signal control circuits.

Figure 8B:
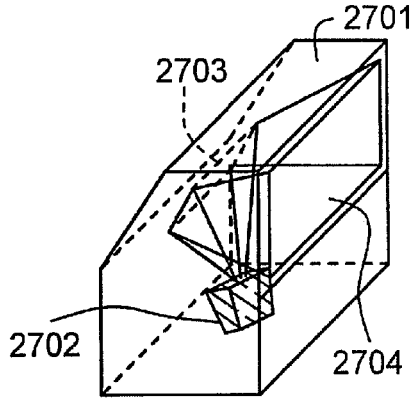

FIG. 8B shows a rear-type projector comprising a main body 2701, a display device 2702, a mirror 2703, and a screen 2704. The present invention is applicable to the display device and other signal control circuits.

Figure 8C:
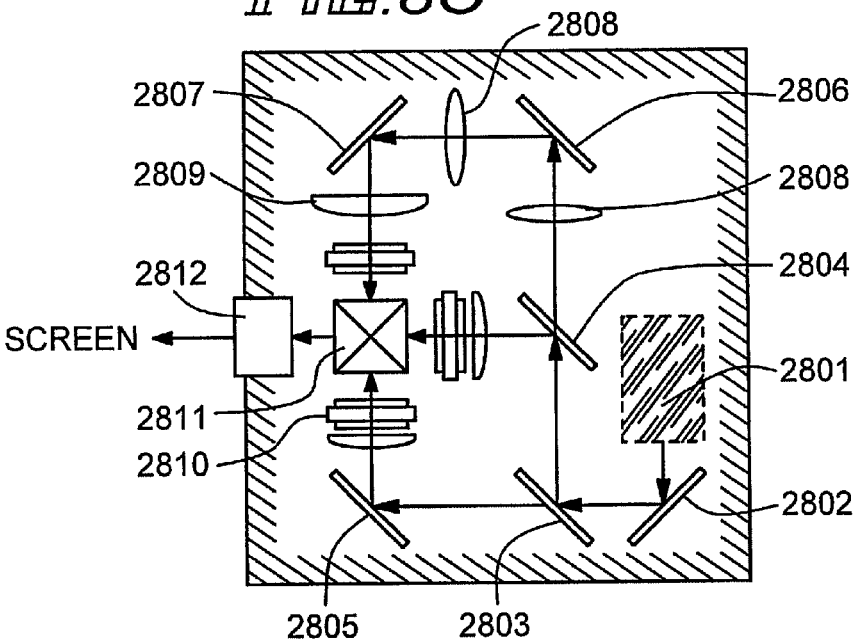

FIG. 8C is a diagram showing an example of the structure of the display devices 2601 and 2702 in FIGS. 8A and 8B. The display device 2601 or 2702 comprises a light source optical system 2801, mirrors 2802 and 2805 to 2807, dichroic mirrors 2803 and 2804, optical lenses 2808, 2809 and 2811, liquid crystal display devices 2810, and a projection optical system 2812. The projection optical system 2812 consists of an optical system including a projection lens. This embodiment shows an example of "three plate type" using three liquid crystal display devices 2810, but not particularly limited thereto. For instance, the invention may be applied also to "single plate type". Further, in the light path indicated by an arrow in FIG. 8C, an optical system such as an optical lens, a film having a polarization function, a film for adjusting a phase difference, an IR film may be provided on discretion of a person who carries out the invention.

Figure 8D:
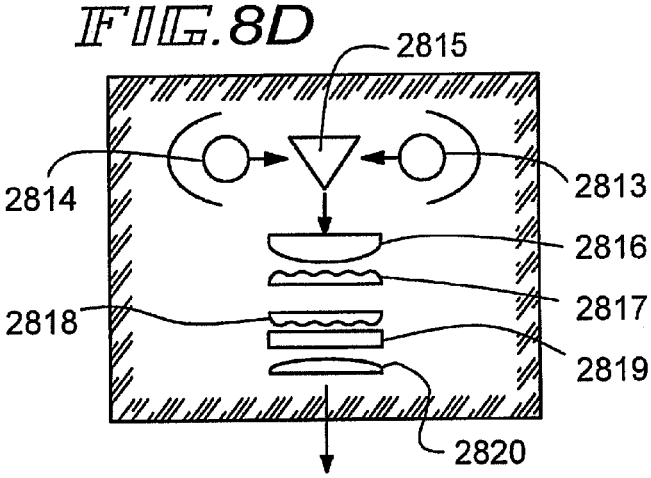

FIG. 8D is a diagram showing an example of the structure of the light source optical system 2801 in FIG. 8C. In this embodiment, the light source optical system 2801 comprises light sources 2813 and 2814, synthetic prism 2815, collimator lenses 2816 and 2820, lens arrays 2817 and 2818, polarizing converter element 2819.

The light source optical system shown in FIG. 8D employs two light sources, but may employ three to four of light sources, or more. Of course, it may employ one light source.

Further, on discretion of a person who carries out the invention, the light source optical system may be provided with an optical system such as an optical lens, a film having a polarization function, a film for adjusting the phase difference, and an IR film.

As described above, the scope of application of the present invention is very wide, and the invention can be applied to electronic equipments of any fields. The electronic equipment of this embodiment can be realized even if any combination of embodiments 1 to 5 is used.

The invention claimed is:

1. A method of manufacturing a semiconductor device comprising:

forming an oxide layer on a single crystal semiconductor substrate;

adding hydrogen ions into the single crystal semiconductor substrate through the oxide layer to form a hydrogen-containing layer;

bonding the single crystal semiconductor substrate and a glass substrate with at least the oxide layer located between the single crystal semiconductor substrate and the glass substrate wherein bonding surfaces between the single crystal semiconductor substrate and the glass substrate are hydrophilic;

separating the single crystal semiconductor substrate by a first heat treatment along the hydrogen-containing layer so that a single crystal semiconductor layer remains on the oxide layer over the glass substrate;

patterning the single crystal semiconductor layer to form an island-like semiconductor layer wherein the single crystalline semiconductor layer subject to the patterning step is 20 to 100 nm thick;

forming a gate insulating film on the island-like semiconductor layer;

forming a gate electrode over the island-like semiconductor layer with the gate insulating film interposed therebetween;

forming an interlayer insulating film over the island-like semiconductor layer and the gate electrode.

2. The method according to claim 1 wherein the single crystal semiconductor layer has a main surface of a {110} plane.

3. The method according to claim 1 wherein the oxide layer is 10–500 nm thick.

4. The method according to claim 1 further comprising a step of performing hydrogenation after the formation of the interlayer insulating film.

5. The method according to claim 1 wherein a source region and a drain region formed in the island-like semiconductor layer contact the oxide layer.

6. The method according to claim 1 wherein the interlayer insulating film comprises silicon nitride.

7. The method according to claim 1 wherein the glass substrate comprises a crystallized glass.

8. A method of manufacturing a semiconductor device comprising:

forming an oxide layer on a single crystal semiconductor substrate;

adding hydrogen ions into the single crystal semiconductor substrate through the oxide layer to form a hydrogen-containing layer;

bonding the single crystal semiconductor substrate and a glass substrate with at least the oxide layer located between the single crystal semiconductor substrate and the glass substrate through bonds by reaction of moisture contained in bonding surfaces between the single crystal semiconductor substrate and the glass substrate;

separating the single crystal semiconductor substrate by a first heat treatment along the hydrogen-containing layer so that a single crystal semiconductor layer remains on the oxide layer over the glass substrate;

flattening a surface of the single crystal semiconductor layer;

patterning the single crystal semiconductor layer to form an island-like semiconductor layer wherein the single crystalline semiconductor layer subject to the patterning step is 20 to 100 nm thick;

forming a gate insulating film on the island-like semiconductor layer;

forming a gate electrode over the island-like semiconductor layer with the gate insulating film interposed therebetween;

forming an interlayer insulating film over the island-like semiconductor layer and the gate electrode.

9. The method according to claim 8 wherein the single crystal semiconductor layer has a main surface of a {110} plane.

10. The method according to claim 8 wherein the oxide layer is 10–500 nm thick.

11. The method according to claim 8 further comprising a step of performing hydrogenation after the formation of the interlayer insulating film.

12. The method according to claim 8 wherein a source region and a drain region formed in the island-like semiconductor layer contact the oxide layer.

13. The method according to claim 8 wherein the insulating film comprises silicon nitride.

14. The method according to claim 8 wherein the glass substrate comprises a crystallized glass.

15. The method according to claim 8 wherein the step of flattening is performed by polishing.

16. The method according to claim 8 wherein the oxide layer functions as a part of a buried insulating layer.

17. A method of manufacturing a semiconductor device comprising:

forming an oxide layer on a single crystal semiconductor substrate;

adding hydrogen ions into the single crystal semiconductor substrate through the oxide layer to form a hydrogen-containing layer, bonding the single crystal semiconductor substrate and a glass substrate with at least the oxide layer located between the single crystal semiconductor substrate and the glass substrate wherein bonding surfaces between the single crystal semiconductor substrate and the glass substrate are hydrophilic;

separating the single crystal semiconductor substrate by a first heat treatment along the hydrogen-containing layer so that a single crystal semiconductor layer remains on the oxide layer over the glass substrate;

patterning the single crystal semiconductor layer to form an island-like semiconductor layer;

forming a gate insulating film on the island-like semiconductor layer;

forming a gate electrode over the island-like semiconductor layer with the gate insulating film interposed therebetween;

adding a first impurity into the island-like semiconductor layer with the gate electrode as a mask;

forming [etching stoppers] *silicon oxide* on side surfaces of the gate electrode;

forming side walls adjacent to the side surfaces of the gate electrode with the [etching stoppers] *silicon oxide* interposed therebetween;

adding a second impurity into the island-like semiconductor layer with the gate electrode and the side walls as a mask so that source and drain regions and LDD regions are formed in the island-like semiconductor layer;

forming a metal film in contact wit a surface of the gate electrode and surfaces of the source and drain regions of the island-like semiconductor layer;

heating the metal film so that upper portions of the source and drain regions become a metal silicide; and forming an interlayer insulating film over the island-like semiconductor layer and the gate electrode.

18. The method according to claim 17 wherein the metal silicide is a cobalt silicide.

19. The method according to claim 17 wherein the second impurity is added into the island-like semiconductor layer so that the source region and the drain region contact the oxide layer.

20. The method according to claim 17 wherein the first impurity is added into the island-like semiconductor layer so that the LDD regions contact the oxide layer.

21. The method according to claim 17 wherein the interlayer insulating film comprises silicon nitride.

22. A method of manufacturing a semiconductor device comprising:

forming an oxide layer on a single crystal semiconductor substrate;

adding hydrogen ions into the single crystal semiconductor substrate through the oxide layer to form a hydrogen-containing layer;

bonding the single crystal semiconductor substrate and a glass substrate with at least the oxide layer located between the single crystal semiconductor substrate and the glass substrate through bonds by reaction of moisture contained in bonding surfaces between the single crystal semiconductor substrate and the glass substrate;

separating the single crystal semiconductor substrate by a first heat treatment along the hydrogen-containing layer so that a single crystal semiconductor layer remains on the oxide layer over the glass substrate;

flattening a surface of the single crystal semiconductor layer;

patterning the single crystal semiconductor layer to form an island-like semiconductor layer;

forming a gate insulating film on the island-like semiconductor layer;

forming a gate electrode over the island-like semiconductor layer with the gate insulating film interposed therebetween;

adding a first impurity into the island-like semiconductor layer with the gate electrode as a mask;

forming [etching stoppers] *silicon oxide* on side surfaces of the gate electrode;

forming side walls adjacent to side surfaces of the gate electrode with the [etching stoppers] *silicon oxide* interposed therebetween;

adding a second impurity into the island-like semiconductor layer with the gate electrode and the side walls as a mask so that source and drain regions and LDD regions are formed in the island-like semiconductor layer;

forming a metal film in contact with a surface of the gate electrode and surfaces of the source and drain regions of the island-like semiconductor layer;

heating the metal film so that upper portions of the source and drain regions become a metal silicide; and forming an interlayer insulating film over the island-like semiconductor layer and the gate electrode.

23. The method according to claim 22 wherein the metal silicide is a cobalt silicide.

24. A method of manufacturing a semiconductor device comprising:

forming an oxide layer on a single crystal semiconductor substrate;

adding hydrogen ions into the single crystal semiconductor substrate through the oxide layer to form a hydrogen-containing layer;

bonding the single crystal semiconductor substrate and a glass substrate with the oxide layer located between the single crystal semiconductor substrate and the glass substrate wherein bonding surfaces between the single crystal semiconductor substrate and the glass substrate are hydrophilic;

separating the single crystal semiconductor substrate by a first heat treatment along the hydrogen-containing layer so that a single crystal semiconductor layer remains on the oxide layer over the glass substrate;

patterning the single crystal semiconductor layer to form an island-like semiconductor layer wherein the single crystalline semiconductor layer subject to the patterning step is 20 to 100 nm thick;

forming a gate insulating film on the island-like semiconductor layer;

forming a gate electrode comprising polysilicon over the island-like semiconductor layer with the gate insulating film interposed therebetween;

forming a metal film in contact with a surface of the gate electrode and surfaces of source and drain regions of the island-like semiconductor layer;

heating the metal film so that an upper portion of the gate electrode and upper portions of the source and drain regions become a metal silicide; and forming an interlayer insulating film over the island-like semiconductor layer and the gate electrode.

25. The method according to claim 24 wherein the metal silicide is cobalt silicide,

26. The method according to claim 1 further comprising a step of flattening a surface of the single crystal$_{13}$semiconductor layer.

27. The method according to claim 1 wherein the oxide layer functions as a part of a buried insulating layer.

28. The method according to claim 17 wherein the single crystal semiconductor layer has a main surface of a {110} plane.

29. The method according to claim 22 wherein the single crystal semiconductor layer has a main surface of a {110} plane.

30. The method according to claim 24 wherein the single crystal semiconductor layer has a main surface of a {110} plane.

31. The method according to claim 17 further comprising a step of performing hydrogenation after the formation of the interlayer insulating film.

32. The method according to claim 22 further comprising a step of performing hydrogenation after the formation of the interlayer insulating film.

33. The method according to claim 24 further comprising a step of performing hydrogenation after the formation of the interlayer insulating film.

34. The method according to claim 22 wherein the first impurity is added into the island-like semiconductor layer so that the LDD regions contact the oxide layer.

35. The method according to claim 1 wherein the bonds are hydrogen bonds.

36. The method according to claim 22 wherein the bonds are hydrogen bonds.

*37. A method of manufacturing a semiconductor device comprising:*

*forming an oxide layer on a single crystal semiconductor substrate;*

*adding hydrogen ions into the single crystal semiconductor substrate through the oxide layer to form a hydrogen-containing layer;*

*bonding the single crystal semiconductor substrate and a glass substrate with at least the oxide layer located between the single crystal semiconductor substrate and the glass substrate wherein bonding surfaces between the single crystal semiconductor substrate and the glass substrate are hydrophilic;*

*separating the single crystal semiconductor substrate by a first heat treatment along the hydrogen-containing layer so that a single crystal semiconductor layer remains on the oxide layer over the glass substrate;*

*patterning the single crystal semiconductor layer to form an island-like semiconductor layer wherein the single crystalline semiconductor layer subject to the patterning step is 20 to 100 nm thick;*

*forming a gate electrode over the island-like semiconductor layer;*

*forming an interlayer insulating film over the island-like semiconductor layer and the gate electrode.*

* * * * *

UNITED STATES PATENT AND TRADEMARK OFFICE

CERTIFICATE OF CORRECTION

PATENT NO. : RE42,097 E
APPLICATION NO. : 12/418334
DATED : February 1, 2011
INVENTOR(S) : Shunpei Yamazaki et al.

It is certified that error appears in the above-identified patent and that said Letters Patent is hereby corrected as shown below:

At column 8, line 21, “referred to me” should be --referred to the--;

At column 13, line 41, “2301, a display” should be --2101, a display--;

At column 16, line 45, “wit a surface” should be --with a surface--;

At column 18, line 13, please delete “13”.

Signed and Sealed this
Fourth Day of October, 2011

David J. Kappos

David J. Kappos
*Director of the United States Patent and Trademark Office*